(12) United States Patent
Sato et al.

(10) Patent No.: US 9,041,491 B2
(45) Date of Patent: May 26, 2015

(54) CAPACITIVE DEVICE AND RESONANCE CIRCUIT

(75) Inventors: Noritaka Sato, Kanagawa (JP);
Masayoshi Kanno, Kanagawa (JP);
Masakazu Yajima, Kanagawa (JP)

(73) Assignee: DEXERIALS CORPORATION, Tokyo (JP)

(*) Notice: Subject to any disclaimer, the term of this patent is extended or adjusted under 35 U.S.C. 154(b) by 587 days.

(21) Appl. No.: 13/384,719

(22) PCT Filed: Jul. 27, 2010

(86) PCT No.: PCT/JP2010/062610
§ 371 (c)(1),
(2), (4) Date: Jan. 18, 2012

(87) PCT Pub. No.: WO2011/013658
PCT Pub. Date: Feb. 3, 2011

(65) Prior Publication Data
US 2012/0112855 A1    May 10, 2012

(30) Foreign Application Priority Data

Jul. 28, 2009  (JP) ................................ 2009-175919
Apr. 23, 2010  (JP) ................................ 2010-100378

(51) Int. Cl.
*H03H 7/00*      (2006.01)
*H01G 4/30*      (2006.01)
*H01G 4/012*     (2006.01)
(Continued)

(52) U.S. Cl.
CPC ......... *H01G 4/30* (2013.01); *H03H 2001/0085* (2013.01); *H01G 4/012* (2013.01); *H01G 4/232* (2013.01); *H03H 7/0115* (2013.01)

(58) Field of Classification Search
CPC ......... H01G 4/30; H01G 4/012; H01G 4/232; H03H 7/0115; H03H 2001/0085
USPC ............. 333/174, 175, 185, 24 C; 361/321.2, 361/277, 278
See application file for complete search history.

(56) References Cited

U.S. PATENT DOCUMENTS 5,835,338 A * 11/1998 Suzuki et al. ............... 361/321.2
6,897,820 B2 * 5/2005 Frenkel ........................ 343/756
(Continued)

FOREIGN PATENT DOCUMENTS

JP      A-57-157513     9/1989
JP      A-9-180956      7/1997
(Continued)

OTHER PUBLICATIONS

International Search Report issued in International Patent Application No. PCT/JP2010-062610 mailed Oct. 26, 2010.

*Primary Examiner* — Benny Lee
*Assistant Examiner* — Rakesh Patel
(74) *Attorney, Agent, or Firm* — Oliff PLC

(57) ABSTRACT

To provide a capacitive device capable of accurately securing a capacitance value, a variable capacitive device capable of sufficiently securing a capacity variability rate, and a resonance circuit that uses the capacitive devices. A capacitive device includes a capacitive device body constituted of a dielectric layer and at least a pair of capacitive device electrodes that sandwich the dielectric layer and cause a desired electric field in the dielectric layer; and stress adjustment portions to adjust a stress caused in the dielectric layer of the capacitive device body.

11 Claims, 12 Drawing Sheets

(51) Int. Cl.
*H01G 4/232* (2006.01)
*H03H 1/00* (2006.01)
*H03H 7/01* (2006.01)

(56) References Cited

U.S. PATENT DOCUMENTS 7,345,558 B2 * 3/2008 Okahashi .................. 333/175
2007/0025054 A1 * 2/2007 Tonogai et al. ............. 361/303
2007/0139861 A1    6/2007 Nakano et al.

FOREIGN PATENT DOCUMENTS

| JP | A-2007-123494 | 5/2007 |
| JP | A-2008-066682 | 3/2008 |
| JP | A-2008-085081 | 4/2008 |
| WO | 2005050679 | 6/2005 |

* cited by examiner (A)

(B)

(A)

(B)

CAPACITIVE DEVICE AND RESONANCE CIRCUIT

The present application is a national stage of International Application No. PCT/JP2010/062610 filed on Jul. 27, 2010 and claims priority to Japanese Patent Application No. 2009-175919 filed on Jul. 28, 2009, and Japanese Patent Application No. 2010-100378 filed on Apr. 23, 2010, the disclosures of which are incorporated herein by reference.

BACKGROUND

The present invention relates to a capacitive device and a resonance circuit equipped with the capacitive device, more particularly, to a capacitive device that is capable of adjusting a stress caused in the capacitive device in use, and a resonance circuit.

In recent years, along with minimizations of electronic apparatuses and improvements in reliabilities thereof, developments of minimized capacitive devices are demanded as electronic components to be used in the electronic apparatuses. To enable a size of capacitive devices to be reduced and a capacity to be increased, a multilayer ceramic capacitor in which an external electrode is formed in a multilayer dielectric device body in which a dielectric layer and an internal electrode layer are laminated alternately is being proposed (Patent Document 1).

Patent Document 1 describes that, by eventually imparting a residual stress to the multilayer dielectric device body of the produced multilayer ceramic capacitor, a dielectric constant and a capacitance to be acquired increase. Since the dielectric constant increases by eventually imparting a residual stress to the multilayer dielectric device body of the multilayer ceramic capacitor as described above, an additional minimization becomes possible.

Patent Document 1: WO 2005/050679

SUMMARY

Problems to be Solved by the Invention

Incidentally, when capacitances differ for each capacitive device to be used, there is a problem that performance of an electronic apparatus cannot be secured accurately. Therefore, there is a demand that the capacitances be the same when the capacitive devices are in use.

Moreover, although a capacitive device (variable capacitive device) that uses a dielectric layer whose capacitance changes base on an applied control voltage is being developed in recent years, there is a demand that a sufficient variability rate be secured also with respect to a small control voltage in such a variable capacitive device.

In view of the circumstances as described above, the present invention provides a capacitive device capable of accurately securing a capacitance value, a variable capacitive device capable of sufficiently securing a capacity variability rate, and a resonance circuit that uses the capacitive devices.

Means for Solving the Problems

To solve the problems above and attain the object above, a capacitive device according to the present invention includes: a capacitive device body constituted of a dielectric layer and at least a pair of capacitive device electrodes that sandwich the dielectric layer and cause a desired electric field in the dielectric layer; and a stress adjustment portion to adjust a stress caused in the dielectric layer of the capacitive device body.

In the capacitive device according to the present invention, a stress caused in the dielectric layer of the capacitive device body can be adjusted by the stress adjustment portion. As a result, characteristics of relative permittivity, a dielectric loss, and the like can be controlled.

A resonance circuit according to the present invention includes a resonance capacitor and a resonance coil connected to the resonance capacitor. The resonance capacitor includes a capacitive device that includes a capacitive device body constituted of a dielectric layer and at least a pair of capacitive device electrodes that sandwich the dielectric layer and cause a desired electric field in the dielectric layer, and a stress adjustment portion that adjusts a stress caused in the dielectric layer of the capacitive device body.

Effect of the Invention

According to the present invention, a capacitive device whose capacitance value is accurately adjusted can be obtained. Further, the capacity variability rate can be increased when a dielectric material whose capacity changes based on a control voltage that is externally applied to the dielectric layer is used. In addition, by using such a capacitive device in the resonance circuit, performance of the resonance circuit can be improved.

Additional features and advantages are described herein, and will be apparent from the following Detailed Description and the figures.

DETAILED DESCRIPTION

Hereinafter, examples of a capacitive device according to the embodiments of the present invention and an electronic apparatus equipped with the capacitive device will be described with reference to the drawings. The embodiments of the present invention will be described in the following order. It should be noted that the present invention is not limited to the examples below.
1. First Embodiment: Example where Present Invention is Applied to Variable Capacitive Device
 1-1 Principle
 1-2 Structure of Variable Capacitive Device
 1-3 Production Method of Variable Capacitive Device
 1-4 Operation of Variable Capacitive Device
2. Second Embodiment: Example where Present Invention is Applied to Variable Capacitive Device
3. Third Embodiment: Example where Present Invention is Applied to Variable Capacitive Device
4. Fourth Embodiment: Example where Present Invention is Applied to Variable Capacitive Device
5. Fifth Embodiment: Example where Present Invention is Applied to Variable Capacitive Device
6. Sixth Embodiment: Example where Present Invention is Applied to Variable Capacitive Device
7. Seventh Embodiment: Example of Electronic Apparatus Equipped with Variable Capacitive Device of Present Invention 1. First Embodiment 1-1 Principle First, to help understand a variable capacitive device according to a first embodiment of the present invention before explaining it, the principle of this embodiment will be described with reference to FIG. 14.

Figure 14:
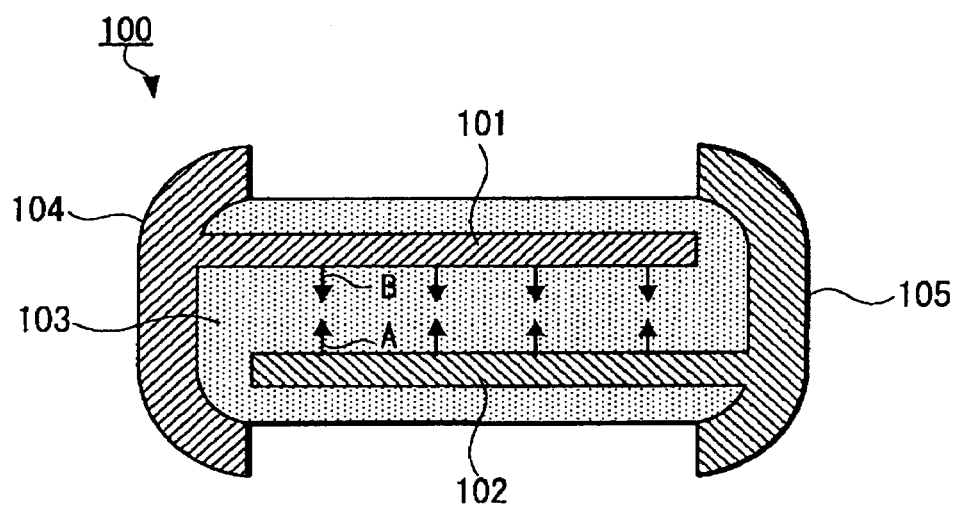
FIG. 14 is a schematic cross-sectional diagram of a variable capacitive device for explaining a principle according to the related art.

FIG. 14 shows a schematic cross-sectional structure of a variable capacitive device of the related art for explaining the principle. A variable capacitive device 100 shown in FIG. 14 is constituted of a dielectric layer 103 and at least a pair of electrodes 101 and 102 sandwiching the dielectric layer 103. Further, the electrode 101 as one of the electrodes is connected to one external terminal 104, and the other electrode 102 is connected to the other external terminal 105.

In the variable capacitive device 100, the dielectric layer 103 is formed of a ferroelectric material, and a capacity changes due to a change in a polarization state based on an externally-applied control voltage.

In the variable capacitive device 100 shown in FIG. 14, a sinter formed of a ferroelectric material is often used as the ferroelectric material that forms the dielectric layer 103 in both the related art and the present invention. When barium titanate is used as a specific material, for example, a crystalline state of the dielectric layer 103 is known to change by an electric field applied thereto. Before explaining such a change, a crystal structure of barium titanate will be described. Although a stable crystal structure differs depending on temperatures, the following description will be given only on the case of room temperature to help understand the description. Barium titanate is known to have a stable tetragonal system that has an intrinsic polarization in a c-axis direction. The sinter of barium titanate is multi-crystal, and the intrinsic polarization does not appear outside. The reason is as follows.

In the sinter of barium titanate, there exists a cubical crystal that comes into contact with a minute area of a tetragonal crystal having an intrinsic polarization (side surface parallel to intrinsic polarization direction) and has no intrinsic polarization in a fairly-small thickness range in an orthogonal direction of the intrinsic polarization, and there also exists, with the cubical crystal intervening, another minute area of a tetragonal crystal that comes into contact with the cubical crystal above and has an intrinsic polarization in a direction opposite to that of the intrinsic polarization above. Further, in a terminal area of the cubical crystal of the minute area in the C-axis direction, there may exist another minute area of a cubical crystal in which a cubical crystal exists in a fairly-small thickness range in a direction 45 degrees from the C axis, the cubical crystal being 90 degrees (orthogonal) with respect to the cubical crystal of the minute area, and that has an intrinsic polarization.

Furthermore, a plurality of minute areas of several tetragonal crystals that exist such that intrinsic polarization areas cancel out polarizations thereof via the cubical crystals constitute a group area. As described above, also in adjacent group areas, there are parallel and orthogonal arrangements with respect to the C-axis direction of the main tetragonal crystal of the group area.

By the reasons above, as the entire sinter of barium titanate, the polarization does not appear outside. It should be noted that in this case, it is known that a lattice constant of a so-called C axis in the polarization direction of the tetragonal crystal is longer than that of the C axis of the original cubical crystal.

A change in a crystalline state of the dielectric layer 103 due to an electric field generated in the dielectric layer 103 in a case where, for example, a sinter of barium titanate is used as the ferroelectric material forming the dielectric layer 103 in the variable capacitive device 100 shown in FIG. 14 will be described. The state changes in a plurality of patterns, and the change is known to depend on an intensity and application time of an electric field, an inversion of a direction and inversion cycle (frequency) of the electric field, and the like.

A typical pattern of the change is that, when a certain electric field is applied to the dielectric layer, in a minute area of a tetragonal crystal having an intrinsic polarization parallel (or almost parallel) to the electric field direction and a minute area of a tetragonal crystal that is adjacent thereto and has an intrinsic polarization in a 90-degree direction, the crystal type changes consecutively as if a fairly-small area surface (domain wall) of the tetragonal crystal therebetween is moving, and the minute area of the tetragonal crystal having a parallel (or almost parallel) intrinsic polarization erodes the minute area of the tetragonal crystal having an intrinsic polarization in the 90-degree direction. Specifically, many polarizations are arranged in the electric field direction. At this time, looking at the two minute areas at the same time, the area extends in the electric field direction and contracts in the direction orthogonal to the electric field direction.

Moreover, when the electric field intensity is large and the electric field is applied for a long time, in group areas parallel and almost parallel to the electric field direction, a fairly-small area surface (domain wall) of the tetragonal crystal moves inside the group areas, and many polarizations are arranged in the electric field direction so as to erode the minute area in the inverse direction. Then, the minute area in the inverse direction is eroded from the circumference and eventually disappears. Of course, the cubical crystal area also disappears. At this time, looking at one group area, there is no extension nor contraction in the direction orthogonal to the electric field direction. Moreover, since the cubical crystal area disappears and changes into a tetragonal crystal, there is a slight extension with respect to the electric field direction that much.

Further, it is known that the entire polarization is inversed without accompanying the movement of the fairly-small area surface (domain wall) of the tetragonal crystal as described above with respect to the applied electric field.

A high dielectric constant can be obtained based on such a change of the crystalline state of barium titanate or change in the polarization direction. Further, by a so-called domain clamping as a DC bias voltage application, it becomes difficult for the polarization to be inversed with respect to an AC electric field by a superimposed AC voltage, and control of changing a capacitance can be performed based on the DC bias voltage.

Based on such a speculation, the inventors of the present invention have found that, by promoting or inhibiting the extension of barium titanate by an applied electric field, the polarization state of barium titanate, that is, the dielectric constant or capacity may be controllable.

Since a dedicated control terminal for controlling a capacity is not structured in the variable capacitive device 100 shown in FIG. 14, a control voltage for changing a capacity and a signal voltage (AC) are applied between the same electrodes (electrodes 101 and 102 in FIG. 14). Therefore, a sum of the control voltage and the signal voltage is applied to the dielectric layer 103, and the crystalline state of barium titanate forming the dielectric layer 103 changes in accordance with the direction of the electric field generated in the dielectric layer 103 so that barium titanate may extend or contract to its original state, or contract more than its original state. As a result, the entire dielectric layer 103 extends in the electric field direction or contracts to its original state, or contract more than its original state.

Moreover, at this time, an electrostatic force (coulomb force) is generated between the pair of electrodes 101 and 102 that generate an electric field in the dielectric layer 103 as indicated by the arrows A and B. Then, by the coulomb force, the electric field (electrodes) acts to compress the dielectric layer 103.

Based on such a speculation, the inventors of the present invention have found that the coulomb force may be inhibiting barium titanate from extending.

By applying a control voltage to the dielectric layer 103 formed of barium titanate, polarization domains are aligned in the electric field direction, and the capacity changes. However, by the reasons described above, by the coulomb force inhibiting the crystalline state of barium titanate from being dislocated and the polarization domains from being aligned, the capacity variability rate is considered to be lowered.

In the variable capacitive device 100 shown in FIG. 14, in a case where the signal voltage (AC) applied to the dielectric layer 103 is larger than the control voltage in particular, there have been problems that the capacity variability rate is lowered based on the control voltage, and a dielectric loss becomes large. Those phenomena are considered to occur because, by the coulomb force that acts between the electrodes, the electric field (electrodes) imparts a compression stress to the dielectric layer 103.

In this regard, the inventors of the present invention have found that, by using a structure with which a stress on the dielectric layer can be lowered or raised in structuring the variable capacitive device, the capacity variability rate can be raised, the dielectric loss can be suppressed, and the capacity can be stabilized.

1-2 Structure of Variable Capacitive Device

Figure 1:
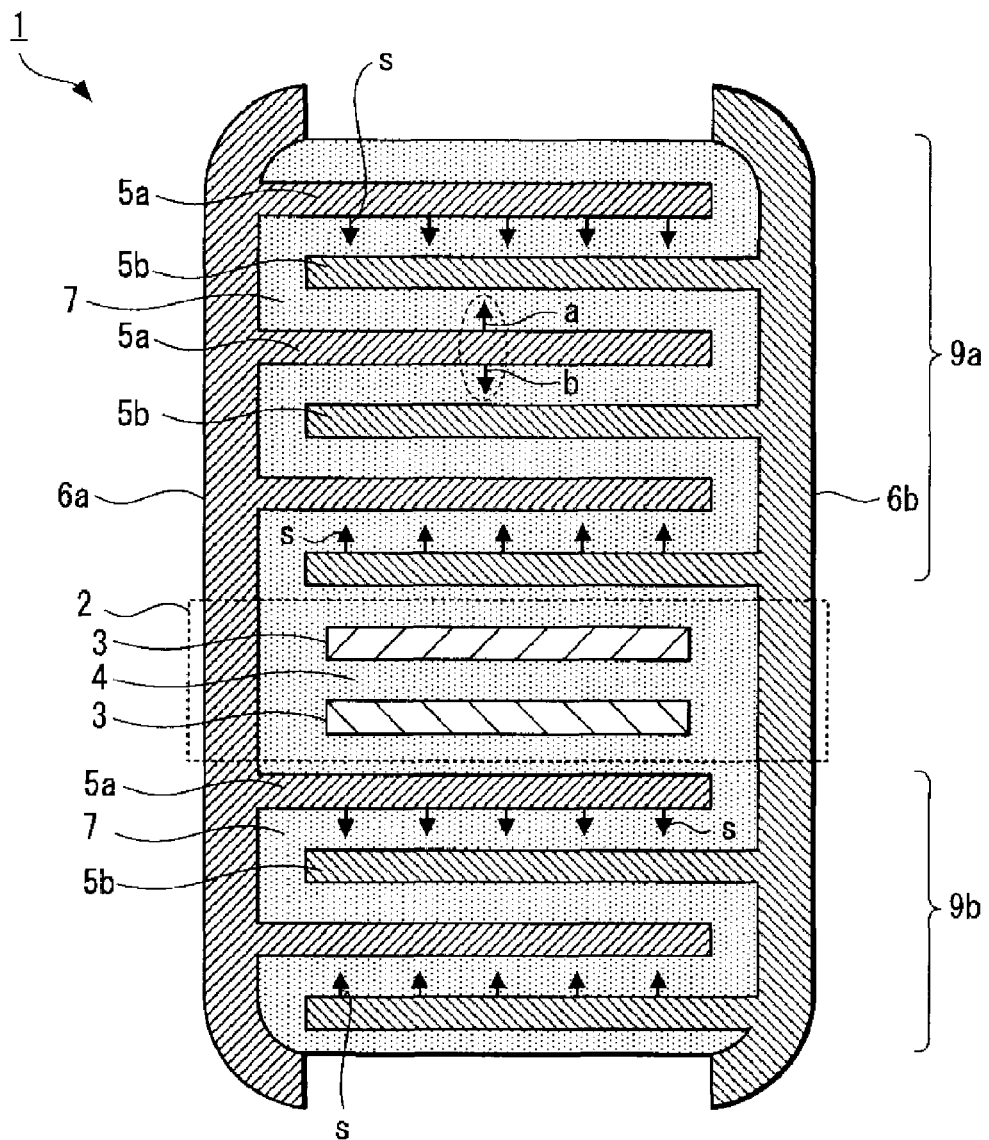
FIG. 1 is a schematic cross-sectional diagram of a variable capacitive device according to a first embodiment of the present invention.

Based on the principle described above, the variable capacitive device according to the first embodiment will be described. FIG. 1 is a schematic cross-sectional diagram of a variable capacitive device 1 of this embodiment.

As shown in FIG. 1, the variable capacitive device 1 of this embodiment includes a variable capacitive device body 2 constituted of a dielectric layer 4 and a pair of electrodes (hereinafter, referred to as variable capacitive device electrodes 3) sandwiching the dielectric layer 4. The variable capacitive device 1 also includes stress adjustment portions 9a and 9b respectively laminated on both sides of the variable capacitive device body 2 in the thickness direction of the dielectric layer 4.

The dielectric layer 4 is formed of a dielectric material whose dielectric constant changes by a control voltage applied between the pair of variable capacitive device electrodes 3 sandwiching the dielectric layer 4, that is, formed of a ferroelectric material whose relative permittivity exceeds 1000, for example.

Specifically, as the material of the dielectric layer 4, a dielectric material that causes an ionic polarization can be used. The ferroelectric material that causes an ionic polarization is a ferroelectric material that is constituted of an ionic crystal material and is electrically polarized due to a displacement of atoms of plus and minus ions. In general, the ferroelectric material that causes an ionic polarization is represented by a chemical formula $ABO_3$ (where 0 represents oxygen element) with two predetermined elements being represented by A and B and has a perovskite structure. Examples of such a ferroelectric material include barium titanate (Ba-$TiO_3$), potassium niobate ($KNbO_3$), and lead titanate (Pb-$TiO_3$). Moreover, as the material for forming the dielectric layer, PZT (lead zirconate titanate) obtained by mixing lead zirconate ($PbZrO_3$) into lead titanate ($PbTiO_3$) may also be used.

Further, a ferroelectric material that causes an electron polarization may be used as the material for forming the dielectric layer 4. In such a ferroelectric material, an electric dipole moment occurs separately in a plus-charge-biased portion and a minus-charge-biased portion to thus cause a polarization. As such a material, in the related art, a rare-earth iron oxide in which a polarization is formed by forming an $Fe^{2+}$ charged surface and an $Fe^{3+}$ charged surface to impart ferroelectric characteristics has been reported. In such a system, it has been reported that a material represented by a formula $(RE)*(TM)_2*O_4$ (O: oxygen element) with a rare earth element and iron group element being represented by RE and TM, respectively, has a high dielectric constant. It should be noted that examples of the rare earth element include Y, Er, Yb, and Lu (particularly Y and heavy rare earth element), and examples of the iron group element include Fe, Co, and Ni (particularly Fe). In addition, examples of $(RE)*(TM)_2*O_4$ include $ErFe_2O_4$, $LuFe_2O_4$, and $YFe_2O_4$.

Figure 2:
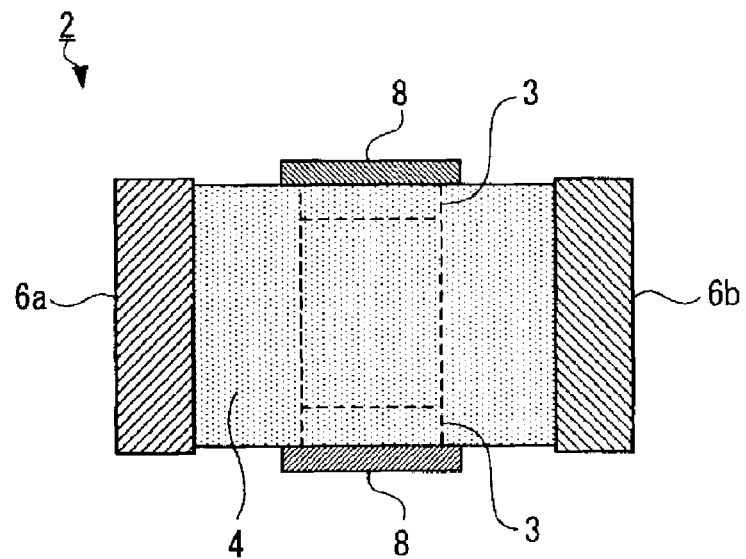
FIG. 2 is a schematic plan view of a variable capacitive device body constituted of the variable capacitive device.

The pair of variable capacitive device electrodes 3 are formed as a flat plate and oppose each other while sandwiching the dielectric layer 4. FIG. 2 is a schematic plan view of the variable capacitive device body 2. As shown in FIG. 2, at an end portion of each of the variable capacitive device electrodes 3, a terminal 8 to which a control voltage or signal voltage (AC) is supplied from outside is formed. As a material for forming the variable capacitive device electrodes 3, a metal material such as Pt, Pb, Pb/Ag, Ni, and an Ni alloy can be used.

In the variable capacitive device body 2 structured as described above, by the control voltage being applied between the pair of opposing variable capacitive device electrodes 3 via the terminals 8, a polarization state of the dielectric layer 4 sandwiched between the variable capacitive device electrodes 3 changes, with the result that a capacity of the variable capacitive device body 2 changes.

The stress adjustment portions 9a and 9b are each constituted of a plurality of first stress adjustment electrodes 5a and second stress adjustment electrodes 5b that are laminated alternately among a stress adjustment dielectric layer 7. In addition, the stress adjustment portions 9a and 9b are respectively formed above one of the variable capacitive device electrodes 3 of the variable capacitive device body 2 and below the other one of the variable capacitive device electrodes 3. In other words, the stress adjustment portions 9a and 9b are formed to sandwich the variable capacitive device body 2 in the thickness direction of the dielectric layer 4 (direction in which electric field is generated) of the variable capacitive device body 2. Moreover, although the thickness of the stress adjustment dielectric layer (interval among stress adjustment electrodes 5a and 5b) and that of the dielectric layer 4 are the same in FIG. 1, the thicknesses may be different. In addition, the thicknesses of the plurality of stress adjustment dielectric layers 7 (intervals among stress adjustment electrodes 5a and 5b) may also differ.

The material for forming the stress adjustment dielectric layer 7 constituting the stress adjustment portion 9a may be the same as that for forming the dielectric layer 4 constituting the variable capacitive device body 2. In addition, a harder material or a material having a higher compression rate with respect to a stress adjustment voltage (electric field) to be applied than that of the dielectric layer 4 of the variable capacitive device body 2 can be used. Such a material may be selected from the specific examples of the material for forming the dielectric layer 4 constituting the variable capacitive device body 2, or may be selected from normal dielectric materials. Normal dielectric materials include paper, polyethylene terephthalate, polypropylene, polyphenylene sulfide, polystyrene, $TiO_2$, $MgTiO_2$, $SrMgTiO_2$, $Al_2O_3$, and $Ta_2O_5$.

The first stress adjustment electrodes 5a and the second stress adjustment electrodes 5b are each formed as a flat plate like the variable capacitive device electrodes 3 constituting the variable capacitive device body 2 and laminated alternately via the stress adjustment dielectric layer 7 while a parallel relationship with the variable capacitive device electrodes 3 is practically maintained. In the example of FIG. 1, the first stress adjustment electrodes 5a and the second stress adjustment electrodes 5b are laminated three each in the stress adjustment portion 9a laminated above one of the variable capacitive device electrodes 3 of the variable capacitive device body 2. Moreover, the first stress adjustment electrodes 5a and the second stress adjustment electrodes 5b are laminated two each in the stress adjustment portion 9b laminated below the other one of the variable capacitive device electrodes 3 of the variable capacitive device body 2.

Although the electrode structures of the stress adjustment portion 9a as the upper layer and the stress adjustment portion 9b as the lower layer differ in this embodiment as described above, the structures may be the same. Further, although the thickness of the stress adjustment electrodes 5a and 5b and the thickness of the variable capacitive device electrodes 3 are the same in FIG. 1, the thicknesses may differ. In addition, the thickness of the first stress adjustment electrodes 5a and the thickness of the second stress adjustment electrodes 5b may also differ. Moreover, the thickness of the stress adjustment electrodes 5a and 5b provided in the stress adjustment portion 9a and the thickness of the stress adjustment electrodes 5a and 5b provided in the stress adjustment portion 9b may also differ. Further, areas of the stress adjustment electrodes 5a and 5b may also differ. Furthermore, both of the stress adjustment portions 9a and 9b do not necessarily need to be formed. In other words, at least one of those only needs to be formed, and this also holds true in embodiments described below. Moreover, the number of layers of the stress adjustment electrodes is 1/5 to 400 times, favorably 1 to 200 times, more favorably 2 to 100 times the number of layers of the electrodes of the variable capacitive device body, and this also holds true in the embodiments described below. Further, the number of layers of the stress adjustment electrodes is 1/5 to 1000 times, favorably 1 to 1000 times, more favorably 2 to 1000 times the number of layers of the electrodes of the variable capacitive device body, and this also holds true in the embodiments described below.

As the material for forming the first and second stress adjustment electrodes 5a and 5b, a metal material such as Pt, Pb, Pb/Ag, Ni, and an Ni alloy can be used as in the electrodes constituting the variable capacitive device body 2.

The first stress adjustment electrodes 5a are connected to, at end portions thereof, an external terminal 6a formed on one side surface of the laminated body constituted of the variable capacitive device body 2 and the stress adjustment portions 9a and 9b. Further, the second stress adjustment electrodes 5b are connected to, at end portions thereof, an external terminal 6b formed on the other one of the side surfaces of the laminated body constituted of the variable capacitive device body 2 and the stress adjustment portions 9A and 9b.

1-3 Production Method of Variable Capacitive Device

An example of a production method of the variable capacitive device 1 having the structure described above will be described. First, a dielectric sheet formed of a desired dielectric material is prepared. The dielectric sheet constitutes the dielectric layer 4 in the variable capacitive device body 2 and constitutes the stress adjustment dielectric layer 7 in the stress adjustment portions 9a and 9b. The dielectric sheets can be formed by depositing a paste-type dielectric material on, for example, a PET (polyethylene terephthalate) film in a desired thickness. Further, masks having openings corresponding to the areas where the variable capacitive device electrodes 3 constituting the variable capacitive device body 2, the first stress adjustment electrodes 5a, and the second stress adjustment electrodes 5b are formed are prepared.

Next, a conductive paste as a paste of metal particles of Pt, Pb, Pb/Ag, Ni, an Ni alloy, or the like is prepared and applied (silk printing etc.) onto the dielectric sheets prepared in the previous step via the masks. As a result, the variable capacitive device electrodes 3, the first stress adjustment electrodes 5a, or the second stress adjustment electrodes 5b are formed on one surface of the dielectric sheet.

Then, the dielectric sheets on which the variable capacitive device electrodes 3, the first stress adjustment electrodes 5a, and the second stress adjustment electrodes 5b are formed are laminated in a desired order after the surfaces thereof on which the electrodes have been printed are aligned. Further, dielectric sheets on which no electrode is printed are laminated on top and bottom of the laminated body and pressure-bonded.

Then, the pressure-bonded member is calcined at high temperature in a reducing atmosphere, and the dielectric sheets and the electrodes formed of the conductive paste are integrated. In this embodiment, the variable capacitive device 1 is formed as described above.

As described above, since the stress adjustment portions 9a and 9b can be formed by the same method as the variable capacitive device body 2 in the production method of the variable capacitive device 1 of this embodiment, a production process of a multilayer capacitive device of the related art in which a dielectric layer and an electrode are laminated alternately can be applied. Moreover, the material for forming the stress adjustment dielectric layer 7 of the stress adjustment portions 9a and 9b and the material for forming the dielectric layer 4 of the variable capacitive device body 2 may either be the same or different. When using the same material, the production is facilitated. It should be noted that it is favorable to use a material that has a low elastic modulus and is apt to be compressively deformed for the dielectric layer 7 in the vicinity of the variable capacitive device body 2.

1-4 Operation of Variable Capacitive Device

Figure 3:
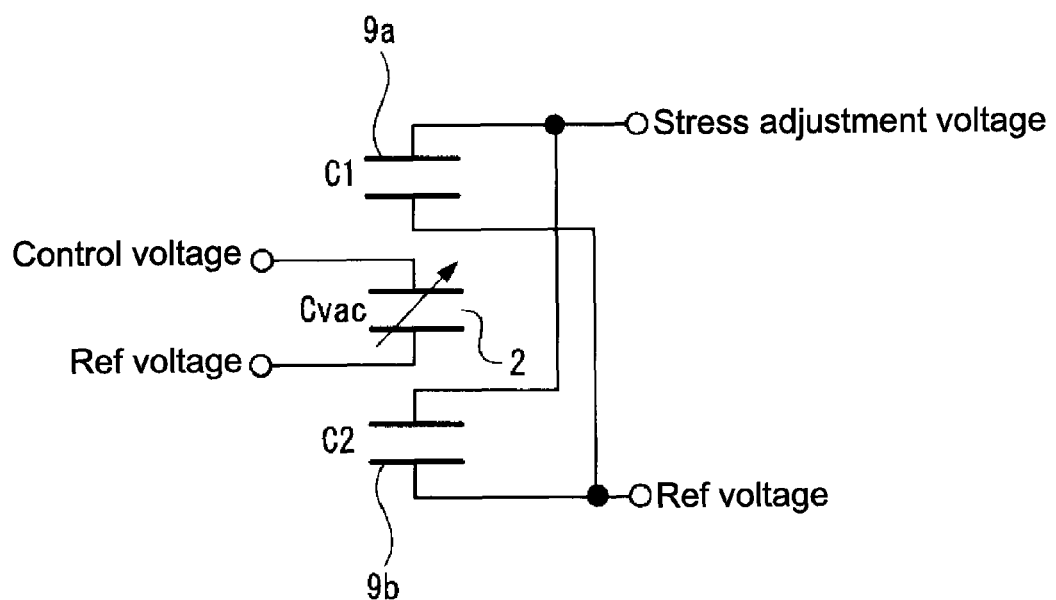
FIG. 3 is an equivalence circuit diagram of the variable capacitive device according to the first embodiment of the present invention.

FIG. 3 is an equivalence circuit diagram of the variable capacitive device 1 of this embodiment. In FIG. 3, a capacity of the dielectric layer 4 of the variable capacitive device body 2 is represented by Cvac. Further, capacities formed between the electrodes in the stress adjustment portion 9a formed above the variable capacitive device body 2 are collectively represented by C1, and capacities formed between the electrodes in the stress adjustment portion 9b formed below the variable capacitive device body 2 are collectively represented by C2.

As shown in FIG. 3, in the stress adjustment portions 9a and 9b, the first stress adjustment electrodes 5a are connected to a stress adjustment voltage input terminal via the external terminal 6a, and the second stress adjustment electrodes 5b are connected to a stress adjustment voltage output terminal via the external terminal 6b.

Further, in the variable capacitive device body 2, one of the variable capacitive device electrodes 3 is connected to a control voltage input terminal via a terminal, and the other one of the variable capacitive device electrodes 3 is connected to a control voltage output terminal via the terminal.

Moreover, in this embodiment, the terminal connected to the variable capacitive device electrodes 3 is also connected to both input and output terminals for AC signals. In other words, in the variable capacitive device body 2 in this embodiment, a signal voltage as well as a control voltage is applied between the variable capacitive device electrodes 3.

In the variable capacitive device 1 structured as described above, a stress adjustment voltage is applied between the first stress adjustment electrodes 5a and the second stress adjustment electrodes 5b. As a result, a coulomb force is generated in the first stress adjustment electrodes 5a as indicated by the arrows s shown in FIG. 1. Consequently, in the first and second stress adjustment electrodes 5a and 5b excluding the outermost electrodes in the stress adjustment portions 9a and 9b, on front and back surface sides of the electrodes, a coulomb force is generated in opposite directions as indicated by the arrows a and b. Therefore, since the coulomb force is canceled out regarding the first and second stress adjustment electrodes 5a and 5b excluding the outermost electrodes, the stress adjustment dielectric layer 7 in the area sandwiched between the first and second stress adjustment electrodes 5a and 5b is not imparted with a compression stress due to the coulomb force (canceled force is not illustrated in figure). As a result, in this embodiment, since the variable capacitive device body 2 is formed in the area sandwiched by the stress adjustment portions 9a and 9b formed above and below the variable capacitive device body 2, the dielectric layer 4 is provided in an area that does not easily receive the compression stress due to the coulomb force. A tension stress is rather imparted to the stress adjustment dielectric layer 7.

When a control voltage is applied between the variable capacitive device electrodes 3 of the variable capacitive device body 2 in such a state, an electric field is generated in the thickness direction of the dielectric layer 4, and the polarization state of the dielectric layer 4 changes due to the electric field. Therefore, the dielectric constant of the dielectric layer 4 changes. Further, in this case, the position at which the dielectric layer 4 is formed is an area that does not easily receive the compression stress and rather receives a tension stress as described above. Thus, it is possible to reduce the compression stress (not shown) due to the coulomb force caused by the electric field generated in the dielectric layer 4 or impart a tension stress.

Accordingly, the polarization state of the dielectric layer 4 easily changes based on the control voltage, and the capacity variability rate of the dielectric layer 4 can be raised. In other words, dislocation of a crystalline structure of the dielectric layer 4 becomes easier than in the related art. Therefore, losses (dielectric losses) caused in the dislocation of the crystalline structure of the dielectric material of the dielectric layer 4 become smaller than that of the related art. Moreover, the capacity variability rate of the dielectric layer 4 can be raised, and an effect in raising the capacity variability rate of the dielectric layer 4 with respect to a low control voltage can be obtained. Furthermore, it is possible to indirectly control the capacity of the dielectric layer 4 by also controlling the voltage applied to the stress adjustment portions, with the result that the capacity variability rate of the dielectric layer 4 can be additionally raised.

Further, by using a material having a higher compression rate with respect to an applied voltage than the material for forming the dielectric layer 4 constituting the variable capacitive device body 2 as the material for forming the stress adjustment dielectric layer 7 of the stress adjustment portions 9a and 9b, a stronger tension stress or compression stress can be caused with respect to the dielectric layer 4. Since the extension in the electric field direction becomes easier when the tension stress is imparted to the dielectric layer 4 as described above, the capacity can be varied based on a small control voltage. Therefore, a variable capacitive device that has a high capacity variability rate with respect to a small control voltage can be obtained.

Figure 4:
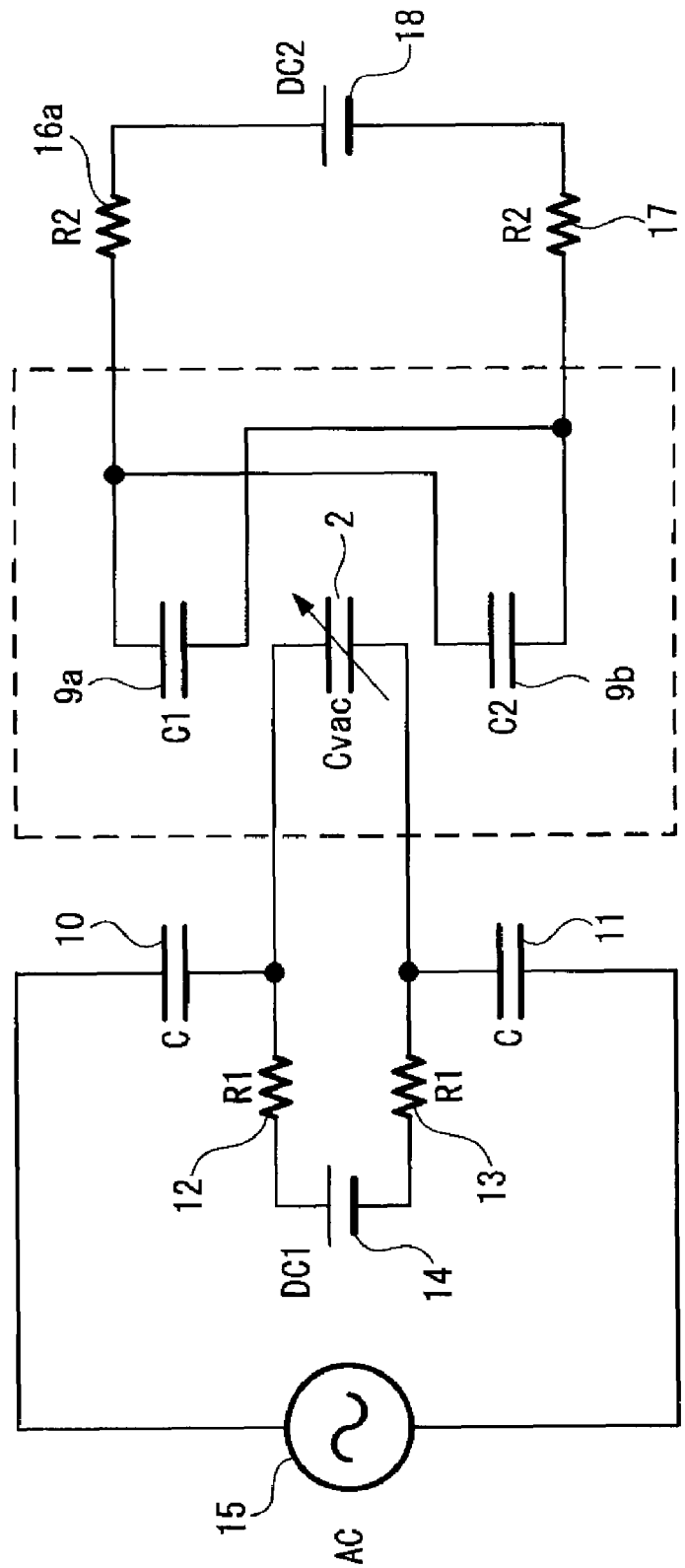
FIG. 4 is a circuit diagram including a signal voltage power supply, a control voltage power supply, and a stress adjustment voltage power supply in a case where the variable capacitive device is operated.

Next, FIG. 4 shows a circuit structure including a signal voltage power supply, a control voltage power supply, and a stress adjustment voltage power supply in a case where the variable capacitive device 1 of this embodiment is operated. In FIG. 4, parts corresponding to FIG. 3 are denoted by the same symbols, and overlapping descriptions will be omitted.

As shown in FIG. 4, the terminal connected to one of the variable capacitive device electrodes 3 of the variable capacitive device body 2 is connected to one of input/output terminals of an AC signal power supply 15 via a bias removal capacitor 10 and connected to an input terminal of a control voltage power supply 14 via a current-limiting resistor 12. The terminal connected to the other one of the variable capacitive device electrodes 3 of the variable capacitive device body 2 is connected to the other one of the input/output terminals of the AC signal power supply 15 via a bias removal capacitor 11 and connected to the output terminal of the control voltage power supply 14 via a current-limiting resistor 13. Further, the terminal 6a connected to the first stress adjustment electrodes 5a of the stress adjustment portions 9a and 9b is connected to an input terminal of a stress adjustment voltage power supply 18 via a current-limiting resistor 16. Furthermore, the terminal 6b connected to the second stress adjustment electrodes 5b of the stress adjustment portions 9a and 9b is connected to an output terminal of the stress adjustment voltage power supply 18 via a current-limiting resistor 17.

In the circuit structure shown in FIG. 4, a signal current (AC signal) flows through the bias removal capacitors 10 and 11 and the variable capacitive device body 2, and a control current (DC bias current) flows through only the variable capacitive device body 2 via the current-limiting resistors 12 and 13. At this time, by changing the control voltage, the capacity of the variable capacitive device body 2 changes, with the result that the signal current also changes.

Further, in this embodiment, a stress adjustment voltage DC2 flows through capacitors of the capacities C1 and C2 structured in the stress adjustment portions 9a and 9b via the current-limiting resistors 16 and 17. Then, by applying the stress adjustment voltage DC2 to the stress adjustment portions 9a and 9b, a stress imparted to the dielectric layer 4 constituting the variable capacitive device body 2 is adjusted based on the principle described above.

In the example shown in FIG. 4, the control voltage power supply 14 and the stress adjustment voltage power supply 18 are provided separately. However, they may be provided commonly. Moreover, by setting the stress adjustment voltage DC2 to be larger than the control voltage DC1, a tension stress can be caused in the dielectric layer 4 of the variable capacitive device body 2. When a tension stress is caused in the dielectric layer 4, a polarization is apt to occur in the dielectric layer 4. Therefore, it becomes possible to raise, while suppressing a change width of the control voltage DC1, a variability rate of the capacity Cvac of the variable capacitive device body 2.

When the control voltage, the signal voltage, and the film thickness of the dielectric layer are represented by DC1, AC, and d, respectively, an electric field intensity E applied to the dielectric layer 4 of the variable capacitive device body 2 is represented by $E=(DC1+AC)/d$. At this time, by setting the stress adjustment voltage DC2 to be larger than the electric field intensity E, an influence of the electric field intensity due to an AC voltage can be made smaller.

Although the variable capacitive device body 2 includes a single layer of dielectric layer 4 in this embodiment, a multilayer variable capacitive device body that has a structure in which the plurality of dielectric layers 4 and variable capacitive device electrodes 3 are laminated alternately is also possible, for example. Also in this case, the same effect as described above can be obtained by forming the plurality of dielectric layers in areas where no compression stress is imparted.

2. Second Embodiment

Variable Capacitive Device

Figure 5:
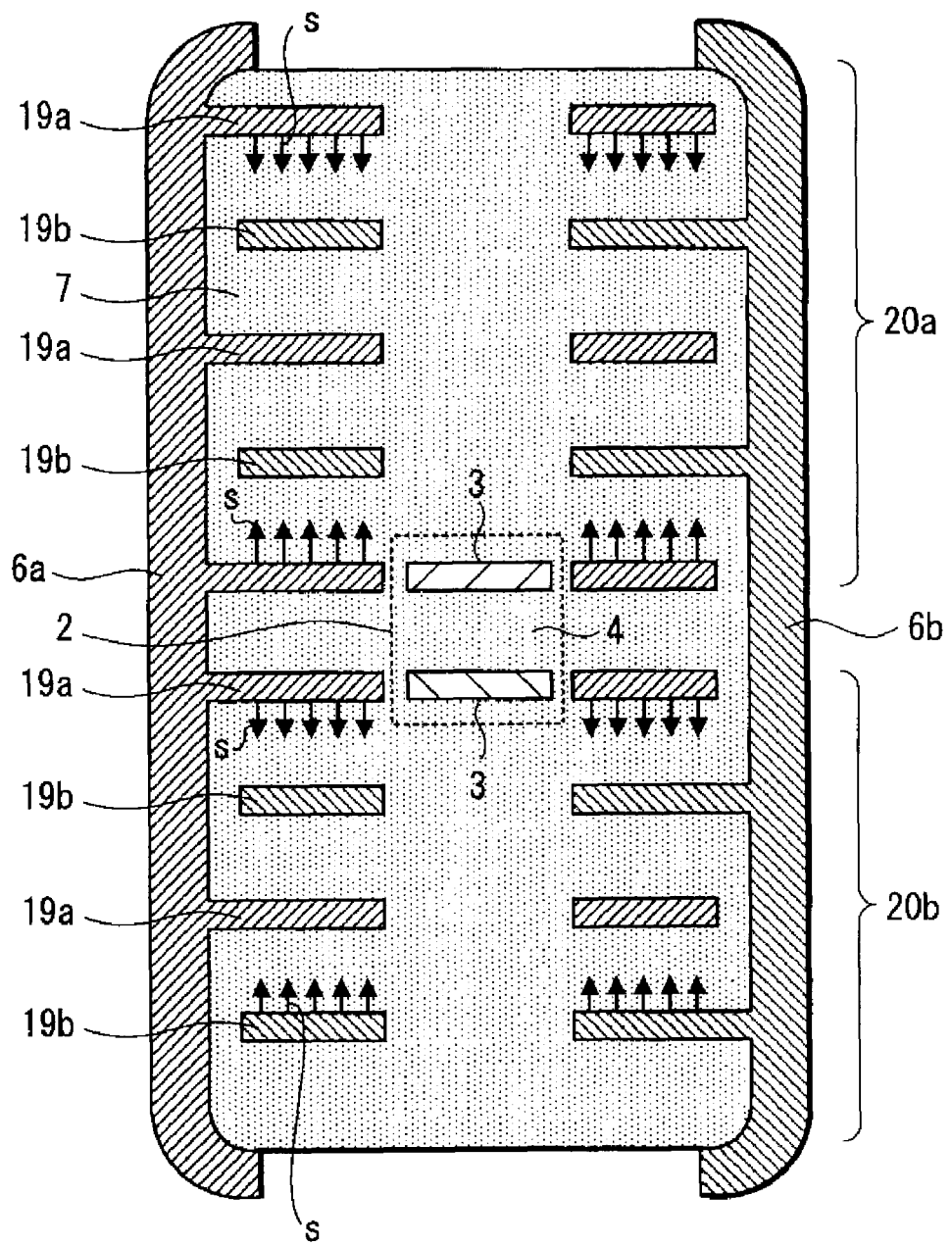
FIG. 5 is a schematic cross-sectional diagram of a variable capacitive device according to a second embodiment of the present invention.

Next, a variable capacitive device according to a second embodiment of the present invention will be described. FIG. 5 is a schematic cross-sectional structure of a variable capacitive device 21 of this embodiment. In FIG. 5, parts corresponding to FIG. 1 are denoted by the same symbols, and overlapping descriptions will be omitted.

In the variable capacitive device 21 of this embodiment, structures of laminated first stress adjustment electrodes 19a and second stress adjustment electrodes 19b in stress adjustment portions 20a and 20b formed above and below the variable capacitive device body 2 are different from those of the first embodiment.

As shown in FIG. 5, in the variable capacitive device 21 of this embodiment, the first stress adjustment electrodes 19a and second stress adjustment electrodes 19b of the stress adjustment portions 20a and 20b are formed on outer circumferential portions of the area where the variable capacitive device body 2 is formed. Further, the pair of variable capacitive device electrodes 3 constituting the variable capacitive device body 2 are formed on the same layer as the stress adjustment electrodes (first stress adjustment electrodes 19a in FIG. 5) constituting the stress adjustment portions 20a and 20b formed above and below the variable capacitive device body 2.

The variable capacitive device 21 of this embodiment can also be formed by the same production method as the first embodiment. In this case, patterning of electrodes only needs to be changed.

Also in such a structure, in the stress adjustment portions 20a and 20b, coulomb forces generated in the first and second stress adjustment electrodes 19a and 19b excluding the outermost electrodes and the first stress adjustment electrodes 19a on the same layer as the variable capacitive device body 2 cancel each other out. Therefore, only the coulomb forces indicated by the arrows s in FIG. 5 remain. As a result, the area where the dielectric layer 4 is formed in the variable capacitive device body 2 hardly receives a compression stress, and thus the same effect as the first embodiment can be obtained.

Further, although the first and second stress adjustment electrodes 19a and 19b of the stress adjustment portions 20a and 20b are formed on outer circumferential portions of the variable capacitive device body 2 in this embodiment, the first and second stress adjustment electrodes 19a and 19b only need to be formed in areas where the variable capacitive device body 2 is not formed. Although dead spaces appear due to minimizations of the pair of variable capacitive device electrodes 3 of the variable capacitive device body 2, thinning of the dielectric layer 4, and the like, the dead spaces can be used effectively in this embodiment.

3. Third Embodiment

Variable Capacitive Device

Figure 6:
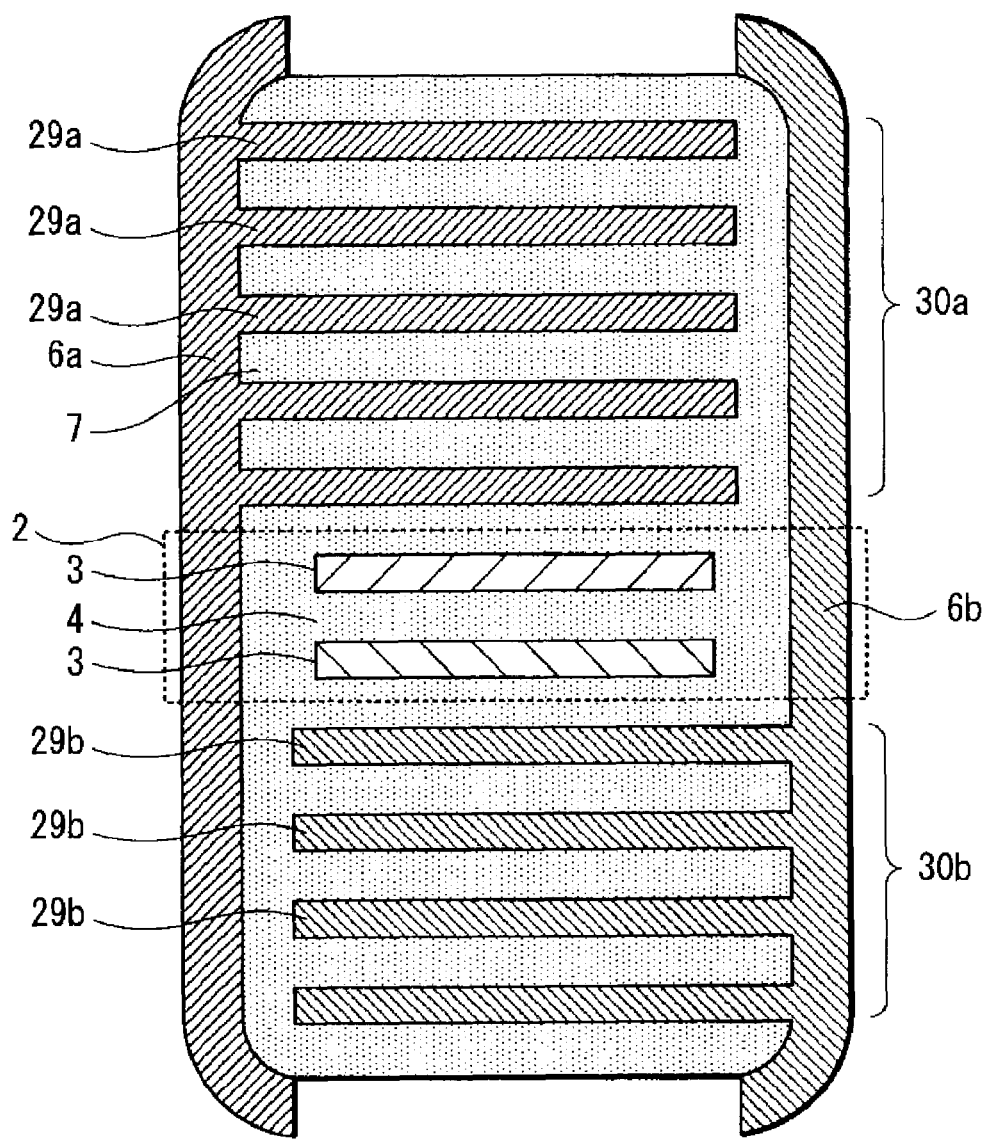
FIG. 6 is a schematic cross-sectional diagram of a variable capacitive device according to a third embodiment of the present invention.

FIG. 6 is a schematic cross-sectional structure of a variable capacitive device according to a third embodiment of the present invention. In FIG. 6, parts corresponding to FIG. 1 are denoted by the same symbols, and overlapping descriptions will be omitted.

As shown in FIG. 6, in a variable capacitive device 31 of this embodiment, a stress adjustment portion 30a formed above one of the variable capacitive device electrodes 3 constituting the variable capacitive device body 2 has a structure in which only first stress adjustment electrodes 29a are laminated via the stress adjustment dielectric layer 7. Further, a stress adjustment portion 30b formed below the other one of the variable capacitive device electrodes 3 constituting the variable capacitive device body 2 has a structure in which only second stress adjustment electrodes 29b are laminated via the stress adjustment dielectric layer 7.

The first stress adjustment electrodes 29a and the second stress adjustment electrodes 29b are connected to the external terminals 6a and 6b, respectively. The variable capacitive device 31 of this embodiment can also be formed by the same production method as the variable capacitive device 1 of the first embodiment.

In this embodiment, the stress adjustment voltage as that described above may be applied to the external terminals 6a and 6b or does not need to be applied at all. Since electrodes of the same polarity are laminated in the stress adjustment portions 30a and 30b, capacitors are not formed between the electrodes in the stress adjustment portions 30a and 30b, and a coulomb force is not generated between the electrodes. Also in this case, however, since the variable capacitive device body 2 is supported by the stress adjustment portions 30a and 30b formed above and below the variable capacitive device body 2, it is difficult for the dielectric layer 4 to be physically deformed. Therefore, a compression stress imparted to the dielectric layer 4 can be reduced. As a result, the capacity variability rate can be raised as in the variable capacitive device 1 of the first embodiment.

As described above, in this embodiment, since the variable capacitive device body 2 is physically supported by the stress adjustment portions 30a and 30b, an effect of relieving a compression stress imparted to the dielectric layer 4 that is a variable capacity area of the variable capacitive device 31 can be obtained. For the stress adjustment portions 30a and 30b to physically support the variable capacitive device body 2, it is favorable to increase the number of first stress adjustment electrodes 29a and second stress adjustment electrodes 29b formed in the stress adjustment portions 30a and 30b.

Incidentally, in FIG. 6, a desired voltage can be applied to the first stress adjustment electrodes 29a and the second stress adjustment electrodes 29b via the external terminals 6a and 6b. However, in this embodiment, since capacities are not formed between the first stress adjustment electrodes 29a and the second stress adjustment electrodes 29b, the first stress adjustment electrodes 29a and the second stress adjustment electrodes 29b do not need to be connected to external terminals as terminals different from the terminals of the variable capacitive device body and may float electrically. In other words, even with a structure in which a voltage is not applied to the first stress adjustment electrodes 29a and the second stress adjustment electrodes 29b, since the electrodes act as beams in the stress adjustment dielectric layer 7, a compression stress applied to the dielectric layer 4 of the variable capacitive device body 2 can be reduced.

Incidentally, in the variable capacitive devices according to the first to third embodiments above, the capacity variability rate has been raised by controlling the coulomb force generated in the dielectric layer of the variable capacitive device body by the stress adjustment portions.

Here, reviewing the stresses inside the dielectric layer of the variable capacitive device body, there is also an internal residual stress caused during production in addition to the two stress discussed in the first to third embodiments. Specifically, the internal stress of the dielectric layer of the variable capacitive device body is considered to be constituted of a stress caused by the coulomb force due to the voltage applied to the electrodes, a stress caused by extension and contraction of the dielectric layer of the dielectric sinter typified by barium titanate (so-called piezoelectricity), and a residual stress caused during production.

The basic idea of the present invention is to influence the internal stress of the variable capacitive device body by structuring the stress adjustment portions separate from the variable capacitive device body and thus obtain improved electric characteristics as an aim of the variable capacitive device body. Therefore, the stress adjustment portions only need to change at least one of the three stresses of the variable capacitive device body.

The variable capacitive device bodies according to the first to third embodiments above have been embodiments on the adjustment, control, or reduction of an internal stress of the variable capacitive device body using a stress caused by a coulomb force generated by the stress adjustment portions. In other words, the change of the internal stress of the stress adjustment portions leads to the change of the stress with respect to the variable capacitive device body, and thus it can be considered that the internal stress of the variable capacitive device body has been changed. The embodiments have been structured on the presupposition that there is an internal residual stress caused during production.

Focusing also on the residual stress, by structuring the stress adjustment portions that are capable of increasing an absolute value of the residual stress during production in the variable capacitive device, the capacity value or capacity variability rate can be raised. Therefore, the stress adjustment portions in the variable capacitive device of the present invention only need to have a structure for additionally increasing an absolute value of the internal stress caused during production, and external terminals for controlling the stress adjustment electrodes constituting the stress adjustment portions do not always need to be structured.

In the first and second embodiments, the stress adjustment electrodes sandwiching the variable capacitive device body are connected to the external terminals different from the terminals connected to the variable capacitive device electrodes and controlled separate from the variable capacitive device body. In other words, the stress adjustment portions and the variable capacitive device body constituting the variable capacitive device have electrically-different structures. In addition, a capacity does not always need to be formed in the stress adjustment portions.

Hereinafter, an example where an external terminal for controlling the stress adjustment electrodes constituting the stress adjustment portions is not provided will be described in detail.

4. Fourth Embodiment

Variable Capacitive Device

Figure 7:
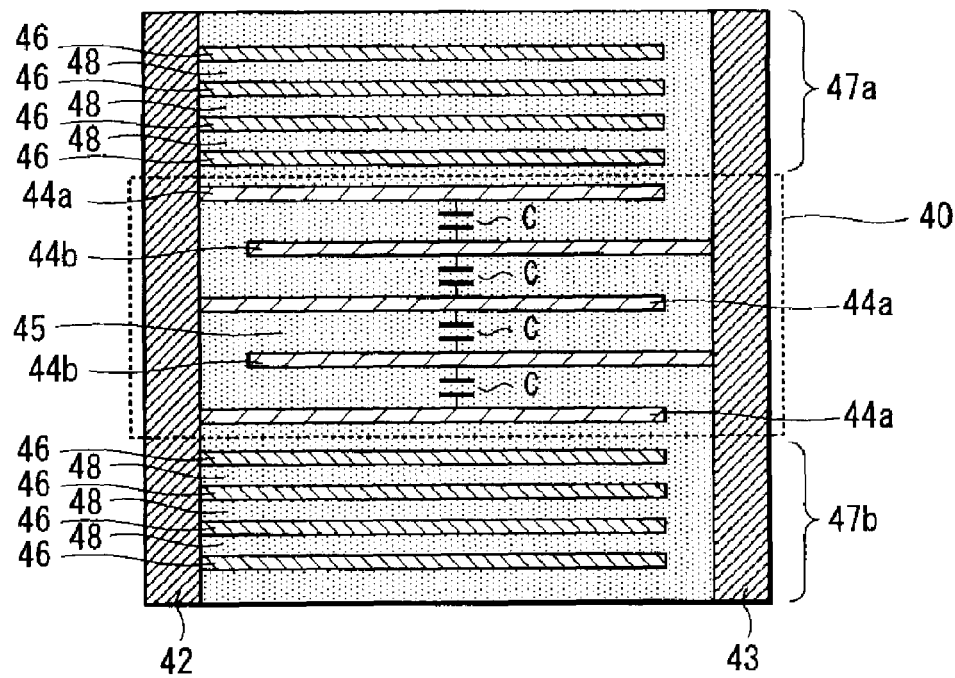
FIG. 7 is a schematic cross-sectional diagram of a variable capacitive device according to a fourth embodiment of the present invention.

FIG. 7 shows a schematic cross-sectional structure of a variable capacitive device according to a fourth embodiment of the present invention.

A variable capacitive device 41 of this embodiment is constituted of a variable capacitive device body 40 and two stress adjustment portions 47a and 47b sandwiching the variable capacitive device body 40.

The variable capacitive device body 40 is constituted of a plurality of first variable capacitive device electrodes 44a and second variable capacitive device electrodes 44b that are laminated alternately among a dielectric layer 45. The dielectric layer 45 is formed of the same material as the dielectric layer of the first embodiment.

The first and second variable capacitive device electrodes 44a and 44b are each formed as a flat plate, and the same material as the variable capacitive device electrodes 3 of the first embodiment can be used for forming the first and second variable capacitive device electrodes 44a and 44b. Further, the first variable capacitive device electrodes 44a are connected to a first terminal 42, and the second variable capacitive device electrodes 44b are connected to a second terminal 43. The first terminal 42 and the second terminal 43 are respectively provided on one side surface of the laminated body constituted of the variable capacitive device body 40 and the stress adjustment portions 47a and 47b as a surface horizontal to the laminated direction, and the other side surface opposing that side surface.

Therefore, the first variable capacitive device electrodes 44a are laminated while being exposed from one side surface as the surface horizontal to the laminated direction of the laminated body, and the second variable capacitive device electrodes 44b are laminated while being exposed from the other side surface opposing that side surface.

A control voltage or signal voltage from outside is supplied between the first terminal 42 and the second terminal 43. Accordingly, the capacity C of the variable capacitive device body 40 becomes variable. The variable capacitive device 41 is used at a desired capacity value.

Further, although FIG. 7 shows only 5 laminated layers of the first and second variable capacitive device electrodes 44a and 44b, the number of layers is not limited thereto, and a desired number of layers can be laminated.

The stress adjustment portions 47a and 47b are constituted of a plurality of stress adjustment electrodes 46 that are laminated among a stress adjustment dielectric layer 48 and laminated above and below the variable capacitive device body 40. In other words, the stress adjustment portions 47a and 47b are laminated in the thickness direction of the dielectric layer 45 of the variable capacitive device body 40 (direction in which electric field is generated) and structured to sandwich the variable capacitive device body 40.

The stress adjustment electrodes 46 have the same shape as the first and second variable capacitive device electrodes 44a and 44b and also formed of the same material as the first and second variable capacitive device electrodes 44a and 44b. Further, the stress adjustment electrodes 46 of the stress adjustment portions 47a and 47b are all connected to the first terminal 42. Therefore, all the stress adjustment electrodes 46 are formed while being exposed from one side surface of the laminated body constituted of the variable capacitive device body 40 and the stress adjustment portions 47a and 47b similar to the first variable capacitive device electrodes 44a.

By connecting the stress adjustment electrodes 46 of the stress adjustment portions 47a and 47b to the same terminal (first terminal 42 in this case), a capacity is not formed among the stress adjustment electrodes 46. Moreover, since the stress adjustment electrodes 46 are connected to the first terminal 42 that is the same terminal to which the variable capacitive device electrodes (first variable capacitive device electrodes 44a in this case) of the variable capacitive device body 40 adjacent to the stress adjustment portions 47a and 47b are connected, a capacity is also not formed between the stress adjustment portions 47a and 47b and the variable capacitive device body 40. Although FIG. 7 shows only 4 laminated layers of the plurality of stress adjustment electrodes 46 in the stress adjustment portions 47a and 47b, the number of layers is not limited thereto, and a desired number of layers can be laminated.

Incidentally, in the variable capacitive device 41 of this embodiment, the capacity value and capacity variability rate of the variable capacitive device body 40 are raised by a residual stress of the stress adjustment portions 47a and 47b caused during production. Moreover, since the residual stress is caused by a difference between contraction rates of the electrode material and the material of the dielectric layer during calcination, as the difference between the contraction rates of those materials increases and as the number of layers of the stress adjustment electrodes 46 of the stress adjustment portions 47a and 47b increases, the residual stress increases. However, when the difference between the contraction rates of the electrode material and the material of the dielectric layer becomes too large and the number of layers of the stress adjustment electrodes 46 increases too much, there is a problem that, for example, a crack may be caused during calcination since an internal strain is accumulated. Therefore, the difference between the contraction rates of the electrode material and the material of the dielectric layer and the number of layers of the stress adjustment electrodes 46 are determined based on the balance between the effect of the residual stress on the capacity value of the variable capacitive device body 40 and production reliability. It should be noted that one of the methods of increasing the difference between the contraction rates of the electrode material and the material of the dielectric layer is making the material of the stress adjustment electrodes contract more. Since the metal material such as Ni as described above is apt to contract more than the material of the dielectric layer in the capacitive device of the related art, for bringing the contraction rate of the dielectric layer and that of the electrodes close to each other, an electrode to be a capacity is often formed using an electrode material obtained by adding the material of the dielectric layer to the metal material such as Ni. By using an electrode material with a reduced additive amount of the material of the dielectric layer with respect to the metal material such as Ni for the stress adjustment electrodes, a difference between the contraction rates can be made large.

The stress adjustment dielectric layer 48 can be formed of the same material as the dielectric layer 45 constituting the variable capacitive device body 40, or can be formed of the same material as that of the first embodiment. The thickness of the stress adjustment dielectric layer 48 (thickness between stress adjustment electrodes 46) may either be the same as or different from that of the dielectric layer 45 among the electrodes of the variable capacitive device body 40. Also, the thicknesses of the stress adjustment dielectric layers 48 may either be the same or different.

The variable capacitive device 41 of this embodiment can be produced by the same production method as the first embodiment. Since the first variable capacitive device electrodes 44a, the second variable capacitive device electrodes 44b, and the stress adjustment electrodes 46 are all formed in the same shape, the same mask can be used, and the process is simplified.

Hereinafter, Example 1 having a more-specific structure than this embodiment and a comparative example in which the stress adjustment portions 47a and 47b are not structured will be described to explain the effect of the stress adjustment portions 47a and 47b in this embodiment.

Example 1

In Example 1, as the material of the dielectric layer 45 and the stress adjustment dielectric layer 48, a material that includes barium titanate as a main component and includes at least one type of accessory component was used, and the thickness of one layer of dielectric layer 45 and stress adjustment dielectric layer 48 was set to be 11 μm. At least one type of accessory component is a component constituted of V, Dy, Mg, Zn, Ca, Mn, B, Zr, Mo, or Sr.

Further, in Example 1, nickel was used as the materials of the first variable capacitive device electrodes 44a, the second variable capacitive device electrodes 44b, and the stress adjustment electrodes 46, and the thicknesses were set to be 2

μm. Moreover, the number of layers of the first and second variable capacitive device electrodes 44a and 44b was set to be 11 layers, and the number of layers of the stress adjustment electrodes 46 in the stress adjustment portions 47a and 47b was set to be 45 layers.

With the structure described above, the variable capacitive device 41 in which a thickness t in the laminated direction of the electrodes is 1.6 mm, a length L from the first terminal 42 to the second terminal 43 is 3.2 mm, a width W vertical to the laminated direction and a line connecting the first terminal 42 and the second terminal 43 is 1.6 mm was formed.

Comparative Example

Next, a variable capacitive device according to a comparative example will be described.

Figure 8:
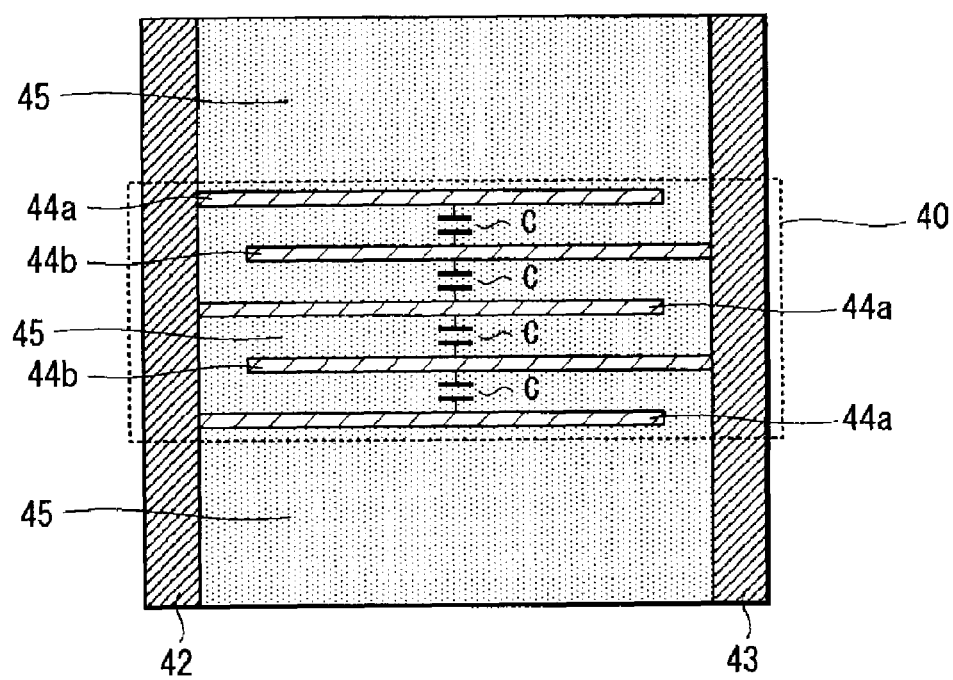
FIG. 8 is a schematic cross-sectional diagram of a variable capacitive device according to a comparative example.

FIG. 8 shows a schematic cross-sectional structure of a variable capacitive device 200 according to the comparative example. The variable capacitive device 200 of the comparative example has the same structure as this embodiment except that the stress adjustment portions are not structured. Therefore, in FIG. 8, parts corresponding to FIG. 7 are denoted by the same symbols, and overlapping descriptions will be omitted.

In the variable capacitive device 200 of the comparative example, the material of the dielectric layer 45 was the same as that of Example 1, the thickness of 1 layer was set to be 11 μm, nickel was used as the materials of the first variable capacitive device electrodes 44a and the second variable capacitive device electrodes 44b, and the thicknesses were set to be 2 μm. Moreover, the number of layers of the first and second variable capacitive device electrodes 44a and 44b was set to be 11 layers. In the comparative example, the stress adjustment portions are not formed above and below the variable capacitive device body 40, but by laminating the dielectric layer 45 only by an amount corresponding to the thicknesses of the stress adjustment portions 47a and 47b of Example 1 instead, the outer shape was made the same as that of Example 1. In other words, also in the comparative example, the variable capacitive device 200 in which a thickness t of the electrode in the laminated direction is 1.6 mm, a length L from the first terminal 42 to the second terminal 43 is 3.2 mm, a width W vertical to the laminated direction and a line connecting the first terminal 42 and the second terminal 43 is 1.6 mm was formed.

[Measurement Result]

Figure 9:
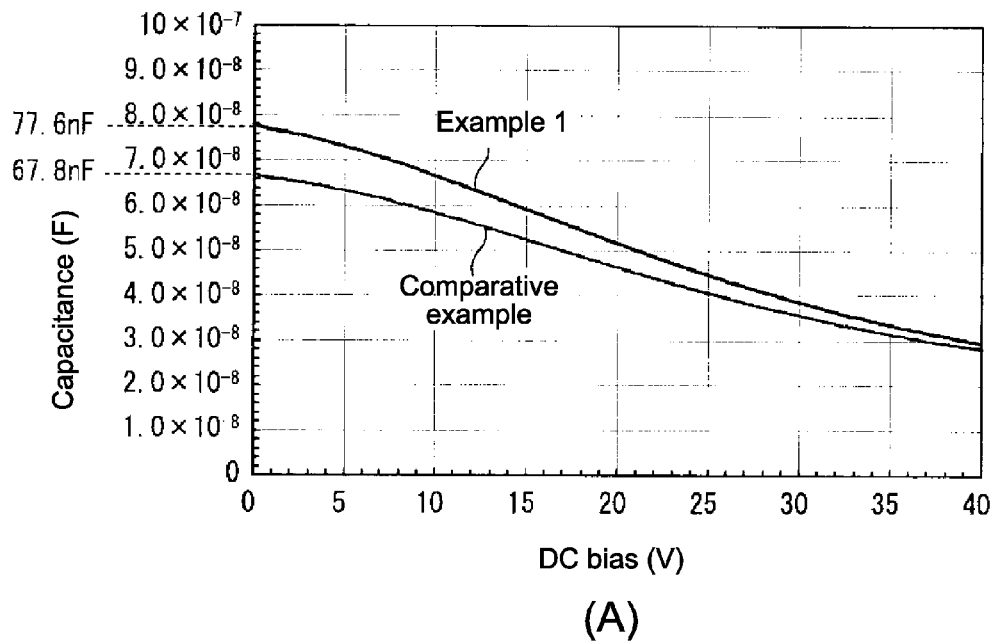
FIGS. 9A and 9B are diagrams showing changes in capacitances and capacitance change rates at a time a DC bias as a control voltage is applied to a variable capacitive device of Example 1 and a variable capacitive device of the comparative example.
Figure 9:
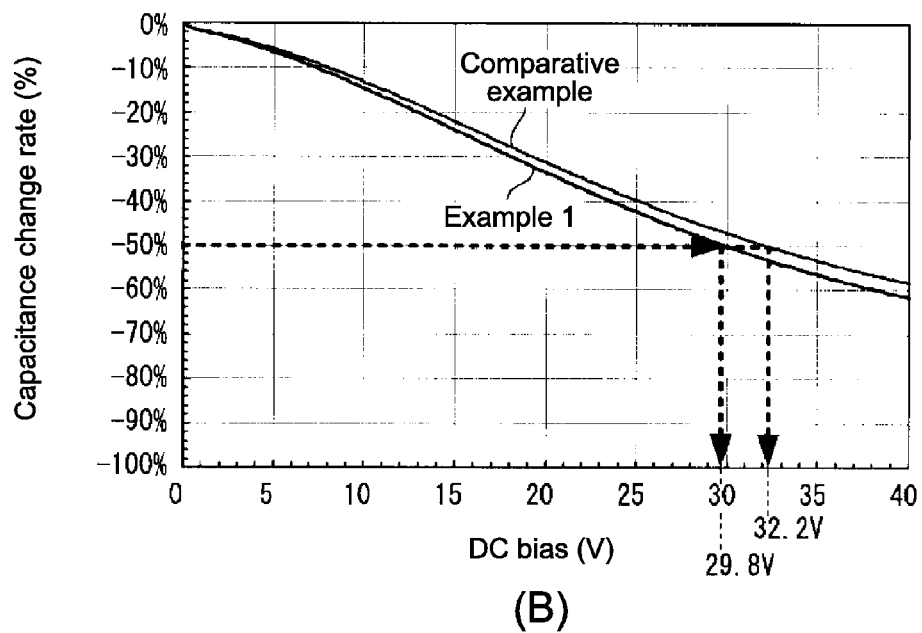

FIGS. 9A and 9B show changes in capacitances and capacitance change rates at a time a DC bias as a control voltage is applied between the first terminal 42 and the second terminal 43 in the variable capacitive device 41 of Example 1 and the variable capacitive device 200 of the comparative example according to the fourth embodiment. In FIG. 9A, the abscissa axis represents a DC bias voltage (V), and the ordinate axis represents a capacitance (F). In FIG. 9B, the abscissa axis represents a DC bias voltage (V), and the ordinate axis represents a capacitance change rate (%). This measurement was performed using an impedance analyzer (Agilent 4294A from Agilent Technologies). The measurement was performed under the measurement conditions that the frequency is 1 kHz and the AC voltage to be applied is 500 mVrms, and the DC bias voltage to be applied was swept every minute from 0 V to 40 V. FIGS. 9A and 9B are third sweeping data.

As shown in FIG. 9A, looking at the capacitance value at a time the DC bias voltage is 0 V, it can be seen that the capacitance is 67.8 nF in the variable capacitive device 200 of the comparative example while the capacitance is 77.6 nF in the variable capacitive device 41 of Example 1. Moreover, as shown in FIG. 9B, looking at the DC bias voltage at which the capacitance becomes half the capacitance at the time the DC bias voltage is 0 V (capacitance change rate becomes −50%), the voltage is 32.2 V in the variable capacitive device 200 of the comparative example while the voltage is 29.8 V in the variable capacitive device 41 of Example 1.

The variable capacitive device body 40 of Example 1 and that of the comparative example have the same structure. Therefore, it shows that, based on the measurement results above, the capacitance increases by the effect of the stress adjustment portions 47a and 47b, and the relative permittivity of the dielectric layer 45 also increases.

It can also be seen that the capacitance of the variable capacitive device 41 of Example 1 can be lowered by a smaller DC bias voltage than in the variable capacitive device 200 of the comparative example, and characteristics of the variable capacitive device 41 of Example 1 as the variable capacitive device are superior than those of the variable capacitive device 200 of the comparative example. Moreover, it can be seen that although a multilayer ceramic capacitor of the related art shown in the comparative example also has characteristics as the variable capacitive device, by providing the stress adjustment portions 47a and 47b as in Example 1, the variable characteristics can be improved.

Next, stresses (residual stresses) caused in the laminated direction of the electrodes and the longitudinal direction of the electrodes were measured in the variable capacitive device 41 of Example 1 and the variable capacitive device 200 of the comparative example according to the fourth embodiment. In the stress measurement, a measurement sample was produced by cutting and polishing the variable capacitive device 41 and the variable capacitive device 200 so that side surfaces thereof in the longitudinal direction of the electrodes are exposed at the center of the width direction of the electrodes, and smoothening the cross-sectional surfaces thereof by ion milling after that. Then, the center of the cross-sectional surfaces was set as a stress measurement area.

Further, the following measurement apparatus was used in the stress measurement.

XRD apparatus: D8 DISCOVER from Bruker AXS, μHR/TXS, X-ray wavelength: CuKα (mixture of Kα1 (1.540 Å), Kα2) Light source size: 0.1*1 mm² (point focus)
Output: 45 kV, 20 mA
Detector: 2D detector Hi-star Then, 2D XRD data for a stress analysis was obtained by irradiating X-rays onto the stress measurement area of each of the measurement samples of the variable capacitive device 41 and the variable capacitive device 200, and the stresses were analyzed based on the obtained data. In the stress analysis, using a (420) diffraction line of barium titanate (so-called 2θ is 118°), the peak position was calculated by a Pearson VII function used in a diffraction peak analysis.

In the measurement samples, the 2D XRD data for a stress analysis in the laminated direction of the electrodes was obtained by setting the measurement sample such that the laminated direction of the electrodes becomes parallel to the X-ray irradiation direction. Moreover, the 2D XRD data for a stress analysis in the longitudinal direction of the electrodes was obtained by setting the measurement sample such that the longitudinal direction of the electrodes becomes parallel to the X-ray irradiation direction.

In the stress measurement of the variable capacitive device 41 of Example 1, the stress in the laminated direction of the electrodes was 48 MPa, and the stress in the longitudinal direction of the electrodes was −89 MPa. Moreover, in the variable capacitive device 200 of the comparative example, the stress in the laminated direction of the electrodes was −27 MPa, and the stress in the longitudinal direction of the electrodes was −87 MPa. Here, a positive sign of the stress indicates a tension stress (stress that acts in tension direction of dielectric layer), and a negative sign of the stress indicates a compression stress (stress that acts in compression direction of dielectric layer).

The residual stress in the laminated direction of the electrodes was 48 MPa (tension stress) in the variable capacitive device 41 of Example 1 while the residual stress was −27 MPa (compression stress) in the variable capacitive device 200 of the comparative example. Accordingly, it was found that, by providing the stress adjustment portions, the stress can be increased 75 MPa (tension stress can be increased). In addition, it was shown that, by providing the stress adjustment portions, the residual stress in the laminated direction of the electrodes can be controlled.

The residual stress in the longitudinal direction of the electrodes was −89 MPa (compression stress) in the variable capacitive device 41 of Example 1 while the residual stress was −82 MPa (compression stress) in the variable capacitive device 200 of the comparative example. Accordingly, it was found that, by providing the stress adjustment portions, the stress can be reduced 7 MPa (compression stress can be increased). In addition, it was shown that, by providing the stress adjustment portions, the residual stress in the longitudinal direction of the electrodes can be controlled.

As described above, it was found that, by providing the stress adjustment portions, the stress of the capacitance portion can be controlled, and the electrical characteristics can be improved.

5. Fifth Embodiment

Variable Capacitive Device

Figure 10:
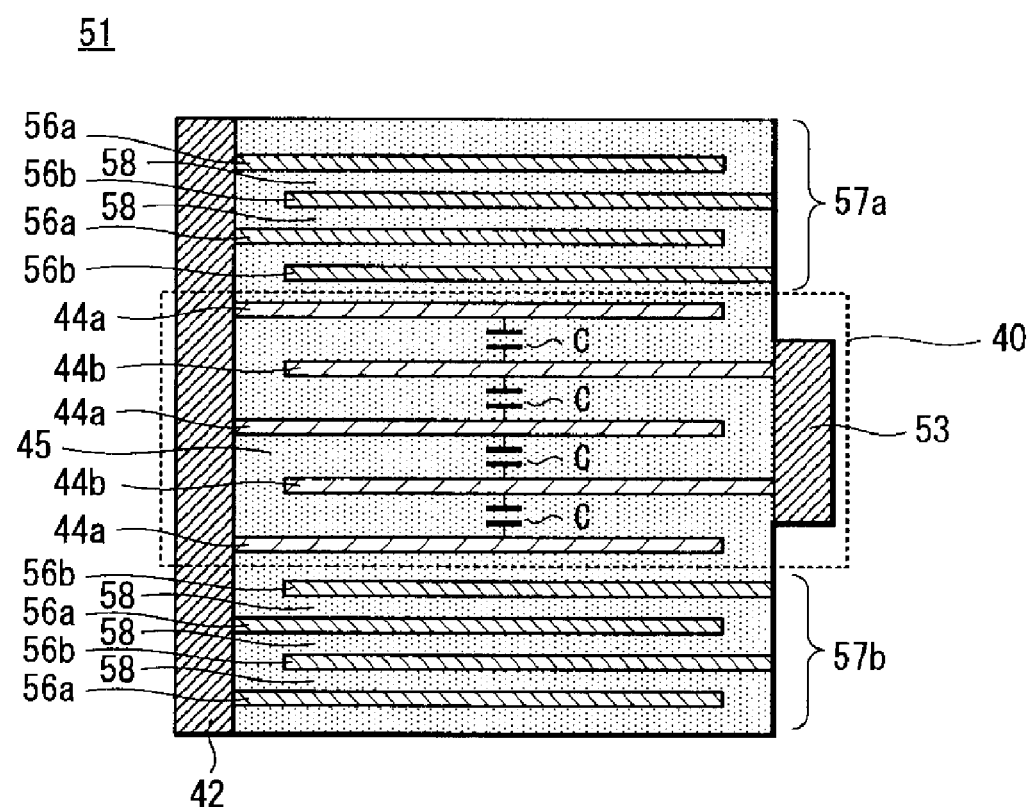
FIG. 10 is a schematic cross-sectional diagram of a variable capacitive device according to a fifth embodiment of the present invention.

Next, a variable capacitive device according to a fifth embodiment of the present invention will be described. FIG. 10 shows a schematic cross-sectional structure of a variable capacitive device 51 of this embodiment. In FIG. 10, parts corresponding to FIG. 7 are denoted by the same symbols, and overlapping descriptions will be omitted.

Stress adjustment portions 57a and 57b in the variable capacitive device 51 of this embodiment are each constituted of a plurality of first stress adjustment electrodes 56a and second stress adjustment electrodes 56b that are laminated alternately while sandwiching a stress adjustment dielectric layer 58 and laminated above and below the variable capacitive device body 40. In other words, the first stress adjustment electrodes 56a and the second stress adjustment electrodes 56b are laminated in the thickness direction (direction in which electric field is generated) of the dielectric layer 45 of the variable capacitive device body 40 and structured to sandwich the variable capacitive device body 40.

The first and second stress adjustment electrodes 56a and 56b have the same shape as the first and second variable capacitive device electrodes 44a and 44b and also formed of the same material as the first and second variable capacitive device electrodes 44a and 44b. The first stress adjustment electrodes 56a are formed while being exposed from one side surface of the laminated body constituted of the variable capacitive device body 40 and the stress adjustment portions 57a and 57b and connected to the first terminal 42, the side surface being parallel to the laminated direction of the laminated body. On the other hand, the second stress adjustment electrodes 56b are formed while being exposed from the other side surface of the laminated body constituted of the variable capacitive device body 40 and the stress adjustment portions 57a and 57b, the side surface being parallel to the laminated direction of the laminated body. In this case, a second terminal 53 is formed in a range where it is connected to only the second variable capacitive device electrodes 44b constituting the variable capacitive device body 40. In other words, in this embodiment, the second stress adjustment electrodes 56b float electrically. As in the related art, the second terminal 53 can be formed by removing, after the second terminal 53 is formed on the side surface of the laminated body, the portions connected to the second stress adjustment electrodes 56b by masking and processing it so that it is only connected to the second variable capacitive device electrodes 44b.

Since a voltage is not applied to the second stress adjustment electrodes 56b in the stress adjustment portions 57a and 57b, a capacity is not formed among the first stress adjustment electrodes 56a and the second stress adjustment electrodes 56b. Moreover, since the first variable capacitive device electrodes 44a connected to the first terminal 42 are arranged at the top and bottom layers of the variable capacitive device body 40, the capacity is also not formed between the variable capacitive device body 40 and the stress adjustment portions 57a and 57b. Although FIG. 10 shows only 4 laminated layers of the first and second stress adjustment electrodes 56a and 56b in the stress adjustment portions 57a and 57b, the number of layers is not limited thereto, and a desired number of layers can be laminated. The determination on the number of layers is the same as that in the fourth embodiment.

Hereinafter, Example 2 having a more-specific structure than this embodiment will be described to explain the effect of the stress adjustment portions 57a and 57b in this embodiment.

Example 2

In Example 2, the dielectric layer 45 and the stress adjustment dielectric layer 58 were formed of the same material as those of Example 1, and the thickness of one layer of each of the dielectric layer 45 and the stress adjustment dielectric layer 58 was set to be 11 μm.

Further, in Example 2, nickel was used as the materials of the first and second variable capacitive device electrodes 44a and 44b and the first and second stress adjustment electrodes 56a and 56b, and the thicknesses were set to be 2 μm. Moreover, the number of layers of the first and second variable capacitive device electrodes 44a and 44b was set to be 11 layers, and the number of layers of the first and second stress adjustment electrodes 56a and 56b in the stress adjustment portions 57a and 57b was set to be 45 layers.

With the structure described above, a variable capacitive device in which a thickness t in the laminated direction of the electrodes is 1.6 mm, a length L from the first terminal 42 to the second terminal 53 is 3.2 mm, a width W vertical to the laminated direction and a line connecting the first terminal 42 and the second terminal 53 is 1.6 mm was formed. In other words, the structure of the stress adjustment electrodes of the variable capacitive device 51 of Example 2 is different from that of the variable capacitive device 41 of Example 1.

[Measurement Result]

Figure 11:
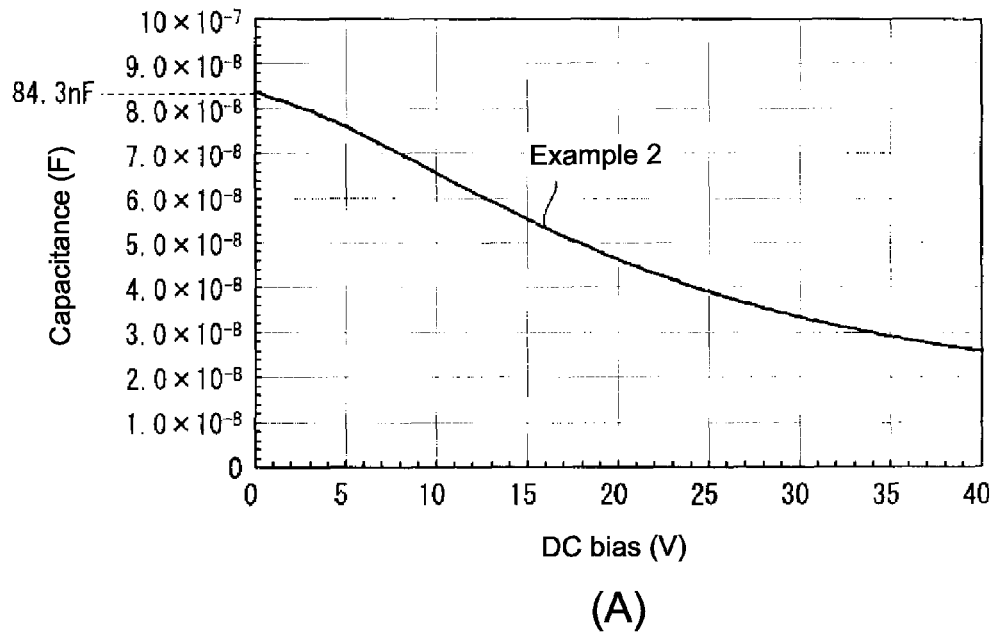
FIGS. 11A and 11B are diagrams showing changes in a capacitance and capacitance change rate at a time a DC bias as a control voltage is applied to a variable capacitive device of Example 2.
Figure 11:
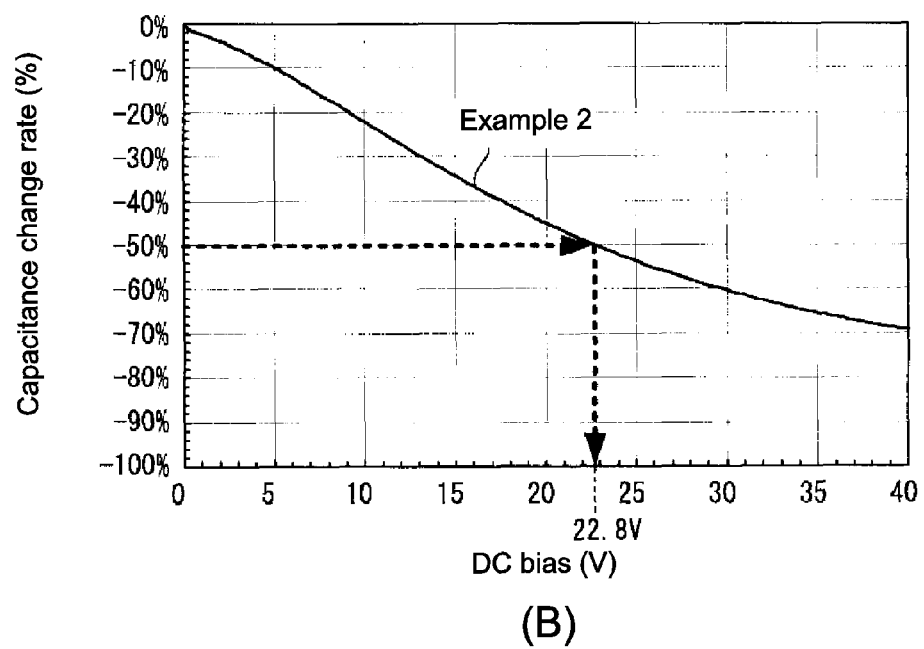

FIGS. 11A and 11B show a capacitance and capacitance change rate at a time a DC bias as a control voltage is applied between the first terminal 42 and the second terminal 53 in the variable capacitive device 51 of Example 2. The measurement on the variable capacitive device 51 of Example 2 was performed under the same conditions as Example 1 and the comparative example described above.

As shown in FIG. 11A, it can be seen that in the variable capacitive device 51 of Example 2, the capacitance value at the time the DC bias voltage is 0 V is 84.3 nF, and the DC bias voltage at which the capacitance becomes half the capacitance at the time the DC bias voltage is 0 V (capacitance change rate becomes −50%) is 22.8 V. As described above, the variable capacitive device 51 of Example 2 has a larger capacitance and a higher relative permittivity of the dielectric layer 45 than the variable capacitive device 41 of Example 1 and the variable capacitive device 200 of the comparative example to both of which the fourth embodiment is applied.

As described above, the reason why the characteristics of the variable capacitive device 51 of this embodiment are superior to the characteristics of the variable capacitive device 41 of the fourth embodiment is considered to be because of a difference in the laminated positions of the first and second stress adjustment electrodes 56a and 56b in the stress adjustment portions 57a and 57b. Since all the stress adjustment electrodes 46 are connected to the first terminal 42 in the variable capacitive device 41 of the fourth embodiment, a space where an electrode is not formed between the second terminal 43 and the stress adjustment electrodes 46 has been present only on the second terminal 43 side. Since the first stress adjustment electrodes 56a exposed from one side surface of the laminated body and the second stress adjustment electrodes 56b exposed from the other side surface are laminated alternately in this embodiment, spaces where electrodes are not formed are arranged with balance on the first terminal 42 side and the second terminal 53 side. As a result, in the variable capacitive device 51 of this embodiment, the contraction caused during production becomes uniform as a whole, and an internal stress is uniformly imparted to the dielectric layer 45 of the variable capacitive device body 40. Therefore, the variable capacitive device 51 of this embodiment is apt to obtain the effect of the stress adjustment portions as compared to the variable capacitive device 41 of the fourth embodiment.

6. Sixth Embodiment

Variable Capacitive Device

Figure 12:
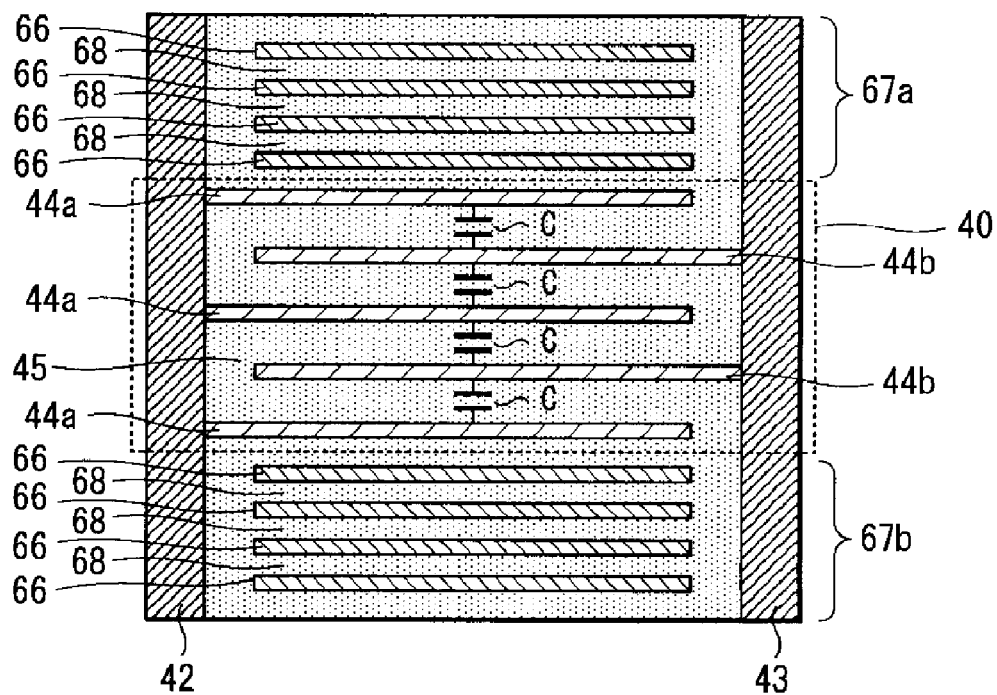
FIG. 12 is a schematic cross-sectional diagram of a variable capacitive device according to a sixth embodiment of the present invention.

Next, a variable capacitive device according to a sixth embodiment of the present invention will be described. FIG. 12 shows a schematic cross-sectional structure of a variable capacitive device 61 of this embodiment. In FIG. 12, parts corresponding to FIG. 8 are denoted by the same symbols, and overlapping descriptions will be omitted.

The variable capacitive device 61 of this embodiment is an example in which stress adjustment electrodes 66 of stress adjustment portions 67a and 67b all float. In other words, in this embodiment, a voltage is not supplied to the stress adjustment electrodes 66.

In this embodiment, the stress adjustment portions 67a and 67b are each constituted of the plurality of stress adjustment electrodes 66 laminated among a stress adjustment dielectric layer 68 and laminated above and below the variable capacitive device body 40. In other words, the stress adjustment electrodes 66 are laminated in the thickness direction (direction in which electric field is generated) of the dielectric layer 45 of the variable capacitive device body 40 and structured to sandwich the variable capacitive device body 40.

The stress adjustment electrodes 66 are formed as a flat plate and formed of the same material as the first and second variable capacitive device electrodes 44a and 44b. Since all the stress adjustment electrodes 66 of the stress adjustment portions 67a and 67b float, the stress adjustment electrodes 66 are not exposed from side surfaces of the laminated body constituted of the variable capacitive device body 40 and the stress adjustment portions 67a and 67b. Therefore, when forming the stress adjustment electrodes 66 of this embodiment, the stress adjustment electrodes 66 need to be formed in a different shape from the first and second variable capacitive device electrodes 44a and 44b using a mask different from that used when forming the first and second variable capacitive device electrodes 44a and 44b.

Although FIG. 12 shows only 4 laminated layers of the stress adjustment electrodes 66 in each of the stress adjustment portions 67a and 67b, the number of layers is not limited thereto, and a desired number of layers can be laminated. The determination on the number of layers is the same as that in the fourth embodiment.

The stress adjustment dielectric layer 68 can be formed of the same material as the dielectric layer 45 constituting the variable capacitive device body 40, or can be formed of the same material as that of the first embodiment. The thickness of the stress adjustment dielectric layer 68 (thickness between stress adjustment electrodes 66) may either be the same as or different from that of the dielectric layer 45. Also, the thicknesses of the stress adjustment dielectric layers 68 may either be the same or different. In this embodiment, the stress adjustment dielectric layer 68 has the same structure as the dielectric layer 45 of the variable capacitive device body 40.

Further, as described above, since the residual stress is caused by a difference between the contraction rates of the electrode material and the material of the dielectric layer, for increasing the residual stress of the stress adjustment portions 67a and 67b, it is favorable to set the area of the stress adjustment electrodes 66 to be larger than that of the first and second variable capacitive device electrodes 44a and 44b. By setting the area of the stress adjustment electrodes 66 to be larger than that of the first and second variable capacitive device electrodes 44a and 44b, the residual stress of the stress adjustment portions 67a and 67b can be increased, and the characteristics of the variable capacitive device 61 can be improved. Moreover, the shape of the stress adjustment electrodes 66 may be a flat plate, but since the stress adjustment electrodes 66 do not need to be connected to an external terminal, the shape can be designed freely.

The variable capacitive device 61 of this embodiment also bears the same effect as the fourth and fifth embodiments.

Incidentally, although the first to sixth embodiments have shown the examples in which a ferroelectric material is used as the material for forming the dielectric layer of the capacitive device body, the present invention is also applicable to a normal capacitive device (i.e., capacitive device in which capacity of capacitive device body does not change when applied with voltage).

In this case, the capacity of the capacitive device body can be changed by controlling the stress adjustment voltage. Therefore, the entire capacitive device has the function as the variable capacitive device.

Further, by structuring the stress adjustment portions in the capacitive device whose capacity does not change when applied with a voltage, the capacitance values can be made to match among the plurality of capacitive devices. As a result, variances in performance of electronic apparatuses can be suppressed when using such a capacitive device in a circuit of the electronic apparatus.

It should be noted that the capacity C (F) of the capacitive device suitable for the present invention also depends on a frequency f (Hz) to be used. The present invention is suitable for a capacitive device having a capacity C (F) with which an impedance Z (ohm) (Z=½ πfc) is 2 ohm or more, favorably 15 ohm or more, more favorably 100 ohm or more.

7. Seventh Embodiment

Resonance Circuit

Next, a resonance circuit according to a seventh embodiment of the present invention will be described. This embodiment describes an example in which the capacitive device of the present invention is applied to a resonance circuit, particularly an example in which the variable capacitive device 1 of the first embodiment is applied. In addition, an example in which the resonance circuit is used in a non-contact IC card will be described in this embodiment.

Figure 13:
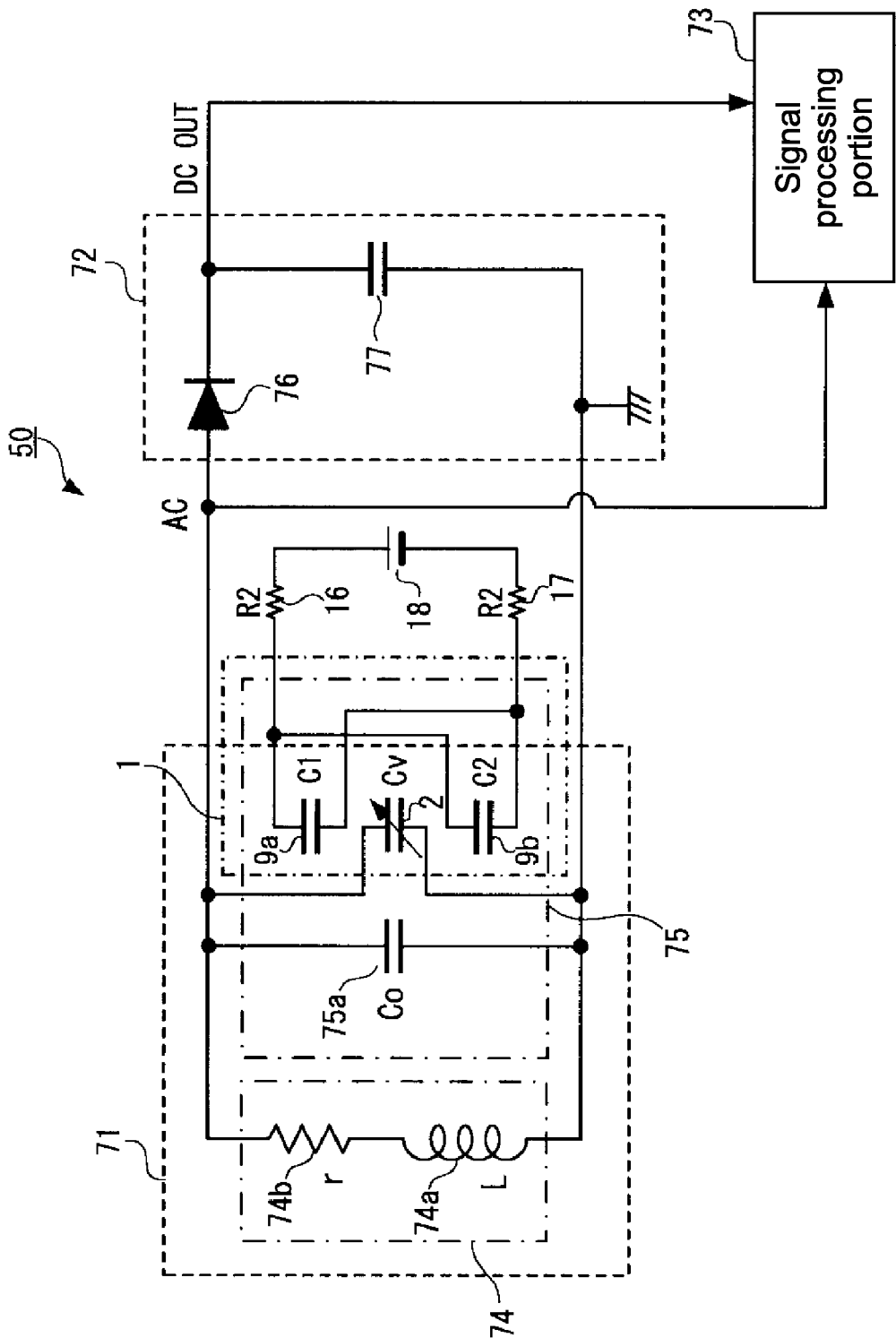
FIG. 13 is a block diagram of a circuit portion in a reception system of a non-contact IC card that uses a resonance circuit according to a seventh embodiment of the present invention.

FIG. 13 is a block diagram of a circuit portion in a reception system of a non-contact IC card 50 that uses the resonance circuit of this embodiment.

It should be noted that in this embodiment, for simplifying the descriptions, a circuit portion in a signal transmission system (modulation system) is omitted. The structure of the transmission-system circuit portion is the same as that of a non-contact IC card of the related art, and the like. Moreover, in FIG. 13, parts corresponding to FIG. 3 are denoted by the same symbols, and overlapping descriptions will be omitted.

The non-contact IC card includes a reception portion 71 (antenna), a rectification portion 72, and a signal processing portion 73 as shown in FIG. 13.

The reception portion 71 is structured by a resonance circuit constituted of a resonance coil 74 and a resonance capacitor 75 and receives, by the resonance circuit, signals transmitted from R/W (not shown) of the non-contact IC card 50. It should be noted in FIG. 13, the resonance coil 74 is separated into an inductance component 74a (L) and a resistance component 74b (r: about several ohm).

In the resonance capacitor 75, a capacitor 75a having a capacity Co and the variable capacitive device body 2 whose capacity Cv changes based on a voltage value of a reception signal (reception voltage value) are connected in parallel. In other words, in this embodiment, the variable capacitive device body 2 is connected in parallel to an antenna of the related art (resonance circuit constituted of resonance coil 74 and capacitor 75a). Further, as shown in FIG. 1, the variable capacitive device body 2 is incorporated into the variable capacitive device 1 including the stress adjustment portions 9a and 9b.

Similar to the antenna of the related art, a capacitor formed of a paraelectric material is used as the capacitor 75a. The capacitor 75a formed of the paraelectric material has low relative permittivity, and a capacity thereof hardly changes irrespective of a type of an input voltage (AC/DC) and a voltage value. Therefore, the capacitor 75a has extremely-stable characteristics with respect to an input signal. Since a resonance frequency of the antenna is not to be deviated in the antenna of the related art, such a capacitor formed of a paraelectric material that is highly stable with respect to an input signal is used.

It should be noted that in an actual circuit, there exists a capacity fluctuation of the reception portion 71 (about several pF) due to variances in the inductance component L of the resonance coil 74, a parasitic capacity of an input terminal of an integrated circuit inside the signal processing portion 73, and the like, and the fluctuation amount differs for each non-contact IC card 50. Therefore, in this embodiment, for suppressing (correcting) such an influence, the capacity Co is adjusted as appropriate by trimming electrode patterns of the capacitor 75a.

The rectification portion 72 is structured by a half-wave rectification circuit constituted of a rectification diode 76 and a rectification capacitor 77 and rectifies an AC voltage received by the reception portion 71 into a DC voltage to output it.

The signal processing portion 73 is mainly constituted of an integrated circuit (LSI: Large Scale Integration) of a semiconductor device and demodulates the AC signal received by the reception portion 71. The LSI inside the signal processing portion 73 is driven by a DC voltage supplied from the rectification portion 72. It should be noted that a non-contact IC card that is the same as that of the related art can be used as the LSI.

Since the stress adjustment portions are structured in the variable capacitive device used in the reception portion in this embodiment, the capacity can be controlled by not only the control voltage applied to the variable resonance capacitor itself but also the control voltage applied to the stress adjustment portions, with the result that a larger variable width can be obtained with a smaller voltage. Further, by thickening the dielectric body of the resonance capacitor since a change load on the resonance capacitor can be reduced as much as the variable width increases, durability is improved, and a large AC voltage can be handled.

Although this embodiment has described the example in which the variable capacitive device of the first embodiment is used as the variable capacitive device of the resonance circuit, any of the variable capacitive devices of the second to sixth embodiments may be used instead. It should be noted that when applying any of the variable capacitive devices of the fourth to sixth embodiments to the resonance circuit of this embodiment, a control voltage to be applied to the stress adjustment electrodes is unnecessary, and the circuit can be omitted.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

DESCRIPTION OF SYMBOLS

1 variable capacitive device
2 variable capacitive device body
3 variable capacitive device electrode
4 dielectric layer
5a first stress adjustment electrode
5b second stress adjustment electrode
6a external terminal
6b external terminal
7 stress adjustment dielectric layer
8 terminal
9a stress adjustment portion
9b stress adjustment portion

The invention claimed is:
1. A resonance circuit, comprising:
a resonance capacitor comprising a capacitive device that comprises
a capacitive device body comprising a dielectric layer and at least a pair of capacitive device electrodes that sandwich the dielectric layer and cause a desired electric field in the dielectric layer,
a stress adjustment portion that adjusts a stress caused in the dielectric layer of the capacitive device body, wherein the stress adjustment portion comprises a stress adjustment dielectric layer and a plurality of stress adjustment electrodes laminated in the stress adjustment dielectric layer;
at least a first pair of external electrodes connected to the at least a pair of capacitive device electrodes; and
at least a second pair of external electrodes connected to the plurality of stress adjustment electrodes; and
a resonance coil connected to the resonance capacitor.

2. A capacitive device, comprising:
a capacitive device body comprising a dielectric layer and at least a pair of capacitive device electrodes that sandwich the dielectric layer and cause a desired electric field in the dielectric layer;
a stress adjustment portion to adjust a stress caused in the dielectric layer of the capacitive device body, wherein the stress adjustment portion comprises a stress adjustment dielectric layer and a plurality of stress adjustment electrodes laminated in the stress adjustment dielectric layer;
at least a first pair of external electrodes connected to the at least a pair of capacitive device electrodes; and
at least a second pair of external electrodes connected to the plurality of stress adjustment electrodes.

3. The capacitive device according to claim 2,
wherein the stress adjustment portion is laminated in a thickness direction of the dielectric layer of the capacitive device body.

4. The capacitive device according to claim 3,
wherein the stress adjustment portion sandwiches the capacitive device body.

5. The capacitive device according to claim 4,
wherein the at least a pair of capacitive device electrodes and the plurality of stress adjustment electrodes are in parallel, and
wherein a stress adjustment voltage is applied to the plurality of stress adjustment electrodes.

6. The capacitive device according to claim 5, wherein the stress adjustment voltage comprises antipolar voltages;
the plurality of stress adjustment electrodes to which the antipolar voltages are applied are arranged alternately in the stress adjustment portion.

7. The capacitive device according to claim 6,
wherein the dielectric layer is formed of a ferroelectric material having a capacity that changes based on a control voltage, and the control voltage is applied between the pair of capacitive device electrodes.

8. The capacitive device according to claim 7,
wherein the stress adjustment voltage is larger than the control voltage.

9. The capacitive device according to claim 2,
wherein the plurality of stress adjustment electrodes are electrically connected to the at least a pair of capacitive device electrodes.

10. The capacitive device according to claim 2,
wherein the plurality of stress adjustment electrodes float electrically.

11. The capacitive device according claim 2,
wherein a plurality of the at least a pair of capacitive device electrodes are laminated via the dielectric layer in the capacitive device body.

* * * * *